(12) United States Patent
Huotari

(10) Patent No.: US 7,122,414 B2
(45) Date of Patent: Oct. 17, 2006

(54) METHOD TO FABRICATE DUAL METAL CMOS DEVICES

(75) Inventor: Hannu Huotari, Espoo (FI)

(73) Assignee: ASM International, Inc., Bilthoven (NL)

( * ) Notice: Subject to any disclaimer, the term of this patent is extended or adjusted under 35 U.S.C. 154(b) by 0 days.

(21) Appl. No.: 10/601,037

(22) Filed: Jun. 19, 2003

(65) Prior Publication Data
US 2004/0106249 A1    Jun. 3, 2004

Related U.S. Application Data

(60) Provisional application No. 60/430,960, filed on Dec. 3, 2002.

(51) Int. Cl.
*H01L 21/8238* (2006.01)

(52) U.S. Cl. .............. 438/199; 438/275; 438/592; 257/369; 257/407; 257/412; 257/E21.002

(58) Field of Classification Search .......... 257/369, 257/388, 407, 412, 751; 438/199, 275, 592
See application file for complete search history.

(56) References Cited

U.S. PATENT DOCUMENTS

| | | | |
|---|---|---|---|
| 5,625,217 A | 4/1997 | Chau et al. | |
| 5,783,478 A | 7/1998 | Chau et al. | |
| 6,066,533 A | 5/2000 | Yu | |
| 6,166,417 A * | 12/2000 | Bai et al. ............ | 257/407 |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,368,954 B1 | 4/2002 | Lopatin et al. | |
| 6,373,111 B1 | 4/2002 | Zheng et al. | |
| 6,383,879 B1 | 5/2002 | Kizilyalli et al. | |
| 6,407,435 B1 | 6/2002 | Ma et al. | |
| 6,458,695 B1 | 10/2002 | Lin et al. | |
| 6,482,740 B1 | 11/2002 | Soininen et al. | |
| 6,506,676 B1 | 1/2003 | Park | |
| 6,511,876 B1 | 1/2003 | Buchanan et al. | |
| 6,518,106 B1 | 2/2003 | Ngai | |
| 6,537,901 B1 | 3/2003 | Cha et al. | |
| 6,579,767 B1 | 6/2003 | Park et al. | |
| 6,596,576 B1 | 7/2003 | Fu et al. | |
| 6,613,695 B1 * | 9/2003 | Pomarede et al. ....... | 438/767 |
| 6,627,503 B1 | 9/2003 | Ma et al. | |
| 6,660,630 B1 * | 12/2003 | Chang et al. ........... | 438/637 |
| 6,696,332 B1 | 2/2004 | Visokay et al. | |
| 6,700,771 B1 | 3/2004 | Bhattacharyya | |
| 6,713,846 B1 | 3/2004 | Senzaki | |
| 6,714,435 B1 | 3/2004 | Dimmler et al. | |
| 6,717,226 B1 | 4/2004 | Hegde et al. | |

(Continued)

FOREIGN PATENT DOCUMENTS

EP    0 854 505 A2    7/1998

(Continued)

OTHER PUBLICATIONS

Chatterjee et al., "CMOS Metal Replacement Gate Transistors using Tantalum Pentoxide Gate Insulator," IEEE, IEDM, 0-7803-4774-9/98, pp. 777-780 (1998).

(Continued)

*Primary Examiner*—Zandra V. Smith
*Assistant Examiner*—Christy L. Novacek
(74) *Attorney, Agent, or Firm*—Knobbe, Martens, Olson & Bear, LLP

(57) ABSTRACT

The present invention relates generally to barrier layers in transistor gate stacks in integrated circuits, and to processes for forming such gate stacks.

28 Claims, 22 Drawing Sheets

U.S. PATENT DOCUMENTS

| | | |
|---|---|---|
| 6,723,581 B1 | 4/2004 | Chabal et al. |
| 6,730,163 B1 | 5/2004 | Vaarstra |
| 6,730,588 B1 | 5/2004 | Schinella |
| 6,861,356 B1* | 3/2005 | Matsuse et al. .............. 438/653 |
| 2001/0041250 A1 | 11/2001 | Werkhoven et al. |
| 2002/0008257 A1 | 1/2002 | Barnak et al. |
| 2002/0030235 A1 | 3/2002 | Agarwal et al. |
| 2002/0096724 A1 | 7/2002 | Liang et al. |
| 2002/0098627 A1* | 7/2002 | Pomarede et al. .......... 438/149 |
| 2003/0165615 A1 | 9/2003 | Aaltonen et al. |
| 2004/0106261 A1 | 6/2004 | Huotari |

FOREIGN PATENT DOCUMENTS

| | | | |
|---|---|---|---|
| WO | WO 94/14198 | | 6/1994 |
| WO | WO 01/29892 A1 | | 4/2001 |
| WO | WO01/29893 | * | 4/2001 |
| WO | WO 01/29893 A1 | | 4/2001 |
| WO | WO 02/43115 A2 | | 5/2002 |

OTHER PUBLICATIONS

Chen et al., "0.18μm Metal Gate Fully-Depleted SOI MOSFETs for Advanced CMOS Applications," Symposium on VLSI Technology Digest of Technical Papers, pp. 25-26 (1999).

Ducroquet et al., "Full CMP Integration of CVD TiN Damascene Sub-0.1-μm Metal Gate Devices For ULSI Applications," IEEE Transactions on Eectron Devices, vol. 48, No. 8, pp. 1816-1821 (2001).

Ferguson et al., "Titanium Nitride Metal Gate Electrode: Effect of Nitrogen Incorporation," Advanced Metallization Conference 2001 (AMC 2001), pp. 115-119.

Hobbs et al., "Sub-Quarter Micron CMOS Process for TiN-Gate MOSFETs with TiO2 Gate Dielectric formed by Titanium Oxidation," Advanced Products Research and Development Lab, Symposium on VLSi Technology Digest of Technical Papers, pp. 133-134 (1999).

Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0-7803-4774-9/98, pp. 781-784 (1998).

Park et al., "Robust Ternary Metal Gate Electrodes for Dual Gate CMOS Devices," IEEE, IEDM, 0-7803-7050-3/02, pp. 671-674 (2001).

Polishchuk, "Dual Work Function Metal Gate CMOS Technology Using Metal Interdiffusion," IEEE Electron Device Letter, vol. 22, No. 9 pp. 444-446 (2001).

Wakabayashi et al., "A Novel W/TiNx Metal Gate CMOS Technology using Nitrogren-Concentration-Controlling TiNx Film," IEEE, IEDM, 0-7803-5410-9/99, pp. 253-256 (1999).

Yagishita et al., "High Performance Damascene Metal Gate MOSFET's for 0.1 μm Regime," IEEE Transactions on Electron Devices, vol. 47, No. 5, pp. 1028-1034 (2000).

Yagishita et al., "Reduction of Threshold Voltage Deviation in Damascene Metal Gate MOSFETs," IEEE, IEDM, 0-7083-5410-9/99, pp. 257-260 (1999).

Yeo et al., "Dual-Metal Gate CMOS Technology with Ultrathin Silicon Nitride Gate Dielectric," IEEE Electronic Device Letters, vol. 22, No. 5, pp. 227-229 (2001).

Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.

Suntola, T., "*Automic Layer Epitaxy*," Handbook of Crystal Growth 3, Thin Films and Epitaxy Part B: Growth Mechanisms and Dynamics, (1994) pp. 601-663.

* cited by examiner

Deposit gate oxide

Deposit gate oxide

Deposit gate oxide

METHOD TO FABRICATE DUAL METAL CMOS DEVICES

REFERENCE TO RELATED APPLICATIONS

The present application claims priority under 35 U.S.C. §119 to U.S. provisional application number 60/430,960, filed Dec. 3, 2002. This application is related to the disclosure of U.S. application Ser. Nos. 10/430,703, filed May 5, 2003 and Ser. No. 10/430,811, filed May 5, 2003.

FIELD OF THE INVENTION

The present invention relates generally to processes for forming dual metal CMOS devices.

BACKGROUND OF THE INVENTION

The gate electrode is one of the most important functional components of MOSFET devices. Polysilicon is now typically used as the gate electrode material in the transistor gate stack. Today's transistors have poly-Si gates so highly doped as to be almost as conductive as metal. However, the solubility of dopants in poly-Si is limited to around $5 \times 10^{20}$ atoms/cm$^3$. The dopant solubility restricts the number of charge carriers in poly-Si. As a result, a depletion layer is formed at the polysilicon dielectric interface when the gate is biased. The depletion region increases the equivalent oxide thickness (EOT) of the gate stack at least 4–5 Å, regardless of the level to which the poly-Si is doped. As a result, it is desirable to replace poly-Si with a metallic material. In practice, metallic materials have an infinite amount of carriers ($5 \times 10^{22}$ atoms/cm$^3$) and therefore the thickness of the depletion region is virtually zero. In other words, the EOT can be decreased 4–5 Å just by replacing the poly-Si gate with a metal gate.

One of the most important properties of the metal gate is its work function. The work function, together with the doping level of substrate, determines the threshold voltage of the MOS-transistor. The work function of a metal electrode material should be about 4.0 to 4.2 eV in NMOS field effect transistors and about 5.0–5.2 eV in PMOS field effect transistors.

Most of the research regarding metal gates/electrodes has been done in relation to the use of physical vapor deposition (PVD). PVD allows the use of a wide range of different materials. However, because of the sputter damage to the gate dielectric layer and the non-uniformity of films deposited on the substrate, it is unlikely that PVD will be used in future production of MOSFETs. Chemical vapor deposition (CVD) methods also have a number of significant drawbacks. CVD methods demand high deposition temperatures in order to achieve low impurity levels. As a result, these methods will degrade the gate dielectric layers. At lower deposition temperatures, CVD methods leave too high a concentration of impurities in the film, also degrading the gate dielectric layer.

In dual metal CMOS processing, where two different metal electrode materials are needed for the PMOS and NMOS transistors, the gate dielectric layer is exposed to etch processes after growing/depositing the first p-type gate electrode over the PMOS in order to make deposition of n-type electrode possible over the NMOS, or vice versa if the n-type gate electrode is deposited first. If the upper region of the gate dielectric layer is exposed to the etch processes used for metal gate stack patterning, the electrical properties of the MOS transistor are likely to be degraded.

Thus, it would be useful to have a way to do the CMOS processing without exposing the gate dielectric layer to the etch processes.

SUMMARY OF THE INVENTION

The preferred embodiments of this invention relate to deposition of metal gates/electrodes of metal-oxide-semi-conductor-field-effect-transistors (MOSFET) by atomic layer deposition (ALD) methods and fabrication process flows for complementary metaloxide-semiconductor transistors (CMOS).

According to one aspect of the invention, a gate stack in an integrated circuit is provided comprising a PMOS region, an NMOS region and a barrier layer. The barrier layer preferably overlies both the NMOS region and the PMOS region. The barrier layer preferably is formed from a conductive material and is less than about 100 Å thick, more preferably less than about 50 Å thick, yet more preferably less than about 30 Å thick.

The gate stack can additionally comprise a first gate electrode layer and a second gate electrode layer. The first gate electrode layer comprises a first gate electrode material and the second gate electrode comprises a second gate electrode material. Preferably the first and second gate electrode materials are conductive. In preferred embodiments, the first gate electrode material is different from the second gate electrode material.

In one embodiment the first gate electrode layer overlies the PMOS region and the second gate electrode region overlies the NMOS region. The work function of a transistor defined in the PMOS region is preferably determined by the first gate electrode material, while the work function of a transistor defined in the NMOS region is preferably determined by the second gate electrode material.

Methods for forming a gate stack in an integrated circuit are also provided. In preferred embodiments a dielectric layer is deposited over a substrate and a barrier layer is deposited directly over the dielectric layer. A first gate electrode layer is then formed over a first region of the substrate and a second gate electrode is formed over a second region of the substrate.

According to one embodiment, a first gate electrode layer is formed by protecting the first region of the substrate with a mask layer and depositing a layer of first gate electrode material over the first and second regions of the substrate. The layer of first gate electrode material is preferably planarized, such as by chemical mechanical polishing. The mask layer is then removed from over the first region of the substrate and a second layer of gate electrode material is deposited to form the second gate electrode layer.

In another embodiment the first gate electrode layer is formed by depositing a first layer of gate electrode material over the first and second regions of the substrate. The layer is then etched to form a first gate electrode layer over the first region. A second layer of gate electrode material is deposited to form a second gate electrode layer.

In a further embodiment a first gate electrode is formed over the first region of the substrate by differentially etching the barrier layer over the second region to a thickness of less than about 100 Å, more preferably less than about 50 Å, and yet more preferably less than about 30 Å. A second layer of gate electrode material is then deposited to form a second gate electrode layer.

DETAILED DESCRIPTION OF THE PREFERRED EMBODIMENTS

Figure 1:
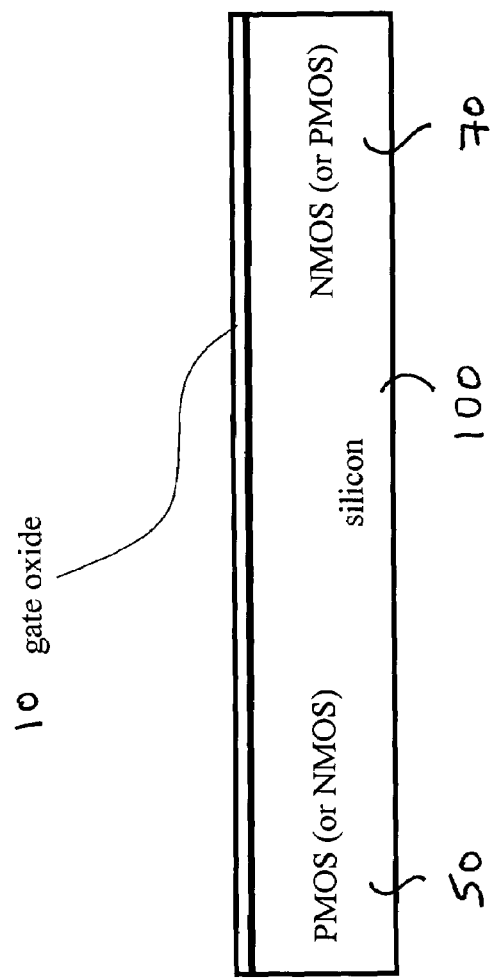
FIGS. 1–9 illustrate steps of one process flow for the formation of a gate electrode, in accordance with an embodiment of the present invention.

While illustrated in the context of transistor gate stacks, the skilled artisan will readily find application for the principles and advantages disclosed herein to other situations where similar electrical and physical properties are desired at an interface that extends across different regions or devices of an integrated circuit.

According to one aspect of the present invention, a gate stack is provided comprising a barrier layer overlying the gate dielectric layer. Preferably, in a CMOS structure the barrier layer is located over both the PMOS and NMOS regions and is thin enough that the work function is dictated by the composition of the material overlying the barrier layer at each region. Typically, the barrier layer is less than about 50 angstroms thick, more preferably less than about 30 angstroms. However, if it is desired to have the barrier layer influence or determine the work function, a layer that is thicker than about 50 angstroms may be employed. A barrier layer with a thickness greater than about 50 angstroms and less than about 100 angstroms will influence the work function but will not determine it, and is contemplated in some embodiments. A barrier layer with a thickness greater than about 100 angstroms will determine the work function. Thus, the barrier layer may be thinner or thicker than the underlying dielectric layer.

The barrier layer typically comprises a conductive material, such as a metal nitride. For example, and without limitation, the barrier layer may be formed from Ni, W, Pt, Co, TiN, $TiAl_xN_y$, TaN, $TaAl_xN_y$, Ru, $RuO_2$, Ir, $IrO_2$, HfN, $HfAl_xN_y$, $HfSi_xN_y$, and $WN_xC_y$ (tungsten nitride carbide). The barrier layer preferably exhibits properties of a diffusion barrier, as described below.

The barrier layer may be deposited by any method known in the art. For example, and without limitation, the barrier layer may be deposited by atomic layer deposition (ALD), chemical vapor deposition (CVD), electrochemical deposition (ECD), physical vapor deposition (PVD), metal organic CVD (MOCVD), plasma enhanced ALD or plasma enhanced CVD. In a particular embodiment the barrier layer is formed by ALD.

For the purpose of the present invention, "ALD" designates a process in which deposition from vapor phase material onto a surface is based on sequential and alternating self-saturating surface reactions. Atomic Layer Deposition (ALD) is a self-limiting process, whereby alternated pulses of reaction precursors saturate a substrate and leave no more than about one monolayer of material per pulse. The precursors are selected such that an adsorbed layer in one pulse leaves a surface termination that is non-reactive with the gas phase reactants of the same pulse, thus ensuring a self-limiting reaction. A subsequent pulse of different reactants do react with the previous termination to enable continued deposition. Thus, each cycle of alternated pulses leaves no more than about one molecular layer of the desired material. Some variations of ALD attempt to increase the deposition rate while still taking advantage of self-limiting reactions and attendant step coverage advantages. The ALD process is preferably carried out at a temperature that is high enough to avoid condensation of reactants on the substrate and low enough to avoid the thermal decomposition of the reactants. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601–663, Elsevier Science B.V. 1994, the disclosure of which is incorporated herein by reference.

In one embodiment, the barrier layer is a nanolaminate structure (i.e., one with multiple layers of different materials, each layer having a thickness on the order of nanometers) or a ternary complex. For example, the barrier layer may be a nanolaminate structure comprising a plurality of thin layers of different materials. Preferably, the nanolaminates comprise amorphous layers. For example, nanolaminates similar to those described in WO01/29893, incorporated herein by reference, can be used.

The gate dielectric layer is preferably characterized by a high dielectric constant (high k). The high dielectric material preferably has a dielectric constant greater than 5. More preferably the high dielectric material has a dielectric constant greater than about 10. Such "high-k" materials include oxides of Group 4 and Group 5 metals (e.g., Ti, Zr, Hf, V, Nb, Ta), as well as more complex oxides. "High-k" materials can also include lanthanide ("rare earth") oxides, such as lanthanum oxide (k≈21), neodymium oxide (k≈16) and cerium dioxide (k≈15). In other arrangements, it will be understood that the high-k material can comprise multiple materials, either as a ternary structure or a laminate of multiple high-k material layers.

Thus, the gate dielectric may be made of any material known in the art, including hafnium oxide ($HfO_2$), zirconium oxide ($ZrO_2$), titanium dioxide ($TiO_2$), tantalum oxide ($Ta_2O_5$), barium strontium titanate (BST), strontium titanate (ST), barium titanate (BT), lead zirconium titanate (PZT) and strontium bismuth tantalate (SBT). The dielectric layer may comprise multiple materials, for example as a ternary structure or a laminate of multiple layers. Preferred gate dielectrics comprise $Zro_2$ or $HfO_2$.

An interfacial layer may be present between the substrate and the gate dielectric layer. The interfacial layer typically comprises $SiO_2$ or $SiO_xN_y$, and is about 5 angstroms thick. In one embodiment the interfacial layer comprises a native oxide.

The barrier layer protects the underlying dielectric layer from sputter damage and etch damage during subsequent processing steps, such as defining and patterning the gate electrodes. The barrier layer can also serve as a diffusion barrier and prevent the diffusion of molecules, atoms or ions from the solid phase on one side of the barrier to the solid phase on the other side of the barrier. For the barrier layer to function effectively as a diffusion barrier, a minimum thickness of at least about one molecular layer is desired, preferably between about 1 and 4 molecular layers, more preferably between about 1 and about 50 molecular layers.

The barrier layer may also serve to prevent the material underneath the barrier from reacting with the surroundings. For example, it may prevent further growth of an underlying interfacial oxide layer during subsequent processing. Many of the processes for formation of the metal gate/electrode involve the use of oxygen, which could increase the thickness of an interfacial layer between the substrate and the gate dielectric. This is particularly true if the dielectric material is a good oxygen conductor. The deposition of a barrier layer, such as a thin layer of conductive material over the dielectric prior to formation of the gate electrode will prevent further oxidation of the substrate or dielectric and thus prevent a resulting increase in equivalent oxide thickness.

A gate electrode is formed over the barrier layer. In the preferred embodiments, the gate electrode comprises a first gate electrode layer over a first region of the substrate, for example over the PMOS region, and a second gate electrode layer over a second region of the substrate, for example the NMOS region. The first and second gate electrode layers are typically adjacent when they are formed, although intervening space or materials can be present initially or later when the gate electrodes are patterned. The first and second gate electrode layers preferably determine the work function of the transistor gate electrodes defined in the first and second regions of the substrate, such as the PMOS and NMOS regions respectively.

In the preferred embodiments the gate material of the first gate electrode layer is different from the gate material of the second gate electrode layer. Materials for use in gate electrodes are typically conductive. Materials that may be used for the gate electrode layers are well known in the art and include, without limitation, polysilicon, Ni, W, Pt, Co, TiN, $TiAl_xN_y$, TaN, $TaAl_xN_y$, Ru, $RuO_2$, Ir, $IrO_2$, HfN, $HfAl_xN_y$, $HfSi_xN_y$, and $WN_xC_y$ (tungsten nitride carbide).

One or both of the first and second gate electrode layers may in turn be covered by an additional layer of conductive material. The composition of the additional layer may be the same as one or both of the gate electrode layers. Alternatively, the composition of the additional layer of conductive material may be different from both of the underlying gate electrode layers. When an overlying conductive layer is employed, it is possible to control the work function of the gate electrodes by varying the thickness of the lower first and second gate electrode layers between about 0 and about 100 angstroms. The thinner the lower first and second gate electrode layers are, the closer the work function of the gate electrodes is to the work function of the overlying layer of conductive material. When the thickness of the material of the first or second gate electrode layers exceeds about 100 angstroms, the work function of the gate electrode is the same as the work function of the material of the lower first or second gate electrode. In addition, the work function can be influenced by varying the thickness of the barrier layer, as described above.

In some embodiments the barrier layer is formed from the same material as one of the first or the second gate electrode layers. However, in other embodiments the barrier layer is a different material from both gate electrodes.

Exemplary Process Flows

Three preferred process flows for forming a CMOS gate structure with a barrier layer are described below. However, the disclosed process flows are exemplary and not limiting, as other process flows that may be used in this and other contexts will be apparent to the skilled artisan.

FIGS. 1 through 9 illustrate a first process flow for the formation of a gate stack according to one aspect of the invention. A gate dielectric is typically located between the substrate and the overlying gate electrode. In FIG. 1, a gate dielectric 10, such as a gate oxide, is shown over a semiconductor substrate 100 comprising PMOS 50 and NMOS 70 regions. One of skill in the art will recognize that the location of the PMOS 50 and NMOS 70 regions can be reversed. The substrate 100 typically comprises silicon but can in other arrangements comprise $Si_xGe_{1-x}$ and III–IV materials such as GaAs. The substrate 100 can be a bare wafer or can include top layer(s) of epitaxial semiconductor material.

Figure 2:
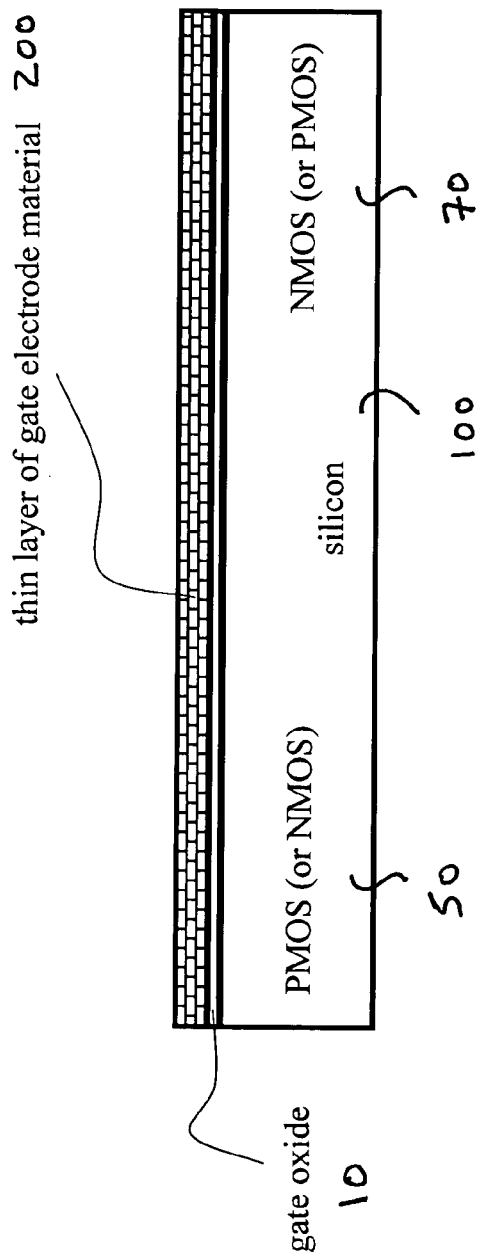

As discussed above, a barrier layer 200 is preferably deposited over the gate dielectric layer 10, overlying both the PMOS 50 and NMOS 70 regions. The barrier layer 200 overlying the gate dielectric 10 is illustrated in FIG. 2. If thick enough, the barrier layer 200 can determine the work function of the whole gate electrode. Thus, the barrier layer is typically kept thin enough that it does not affect the work function, preferably less than about 100 angstroms, more preferably from about 3 to about 50 angstroms, yet more preferably from about 3 to about 30 angstroms. However, a thicker barrier layer may be used if an effect on the work function is desired.

In one embodiment the barrier layer 200 comprises a thin layer of gate electrode material that has been deposited over the gate dielectric 10 and both the NMOS 70 and PMOS 50 regions. The barrier layer 200 is preferably deposited by atomic layer deposition.

Figure 3:
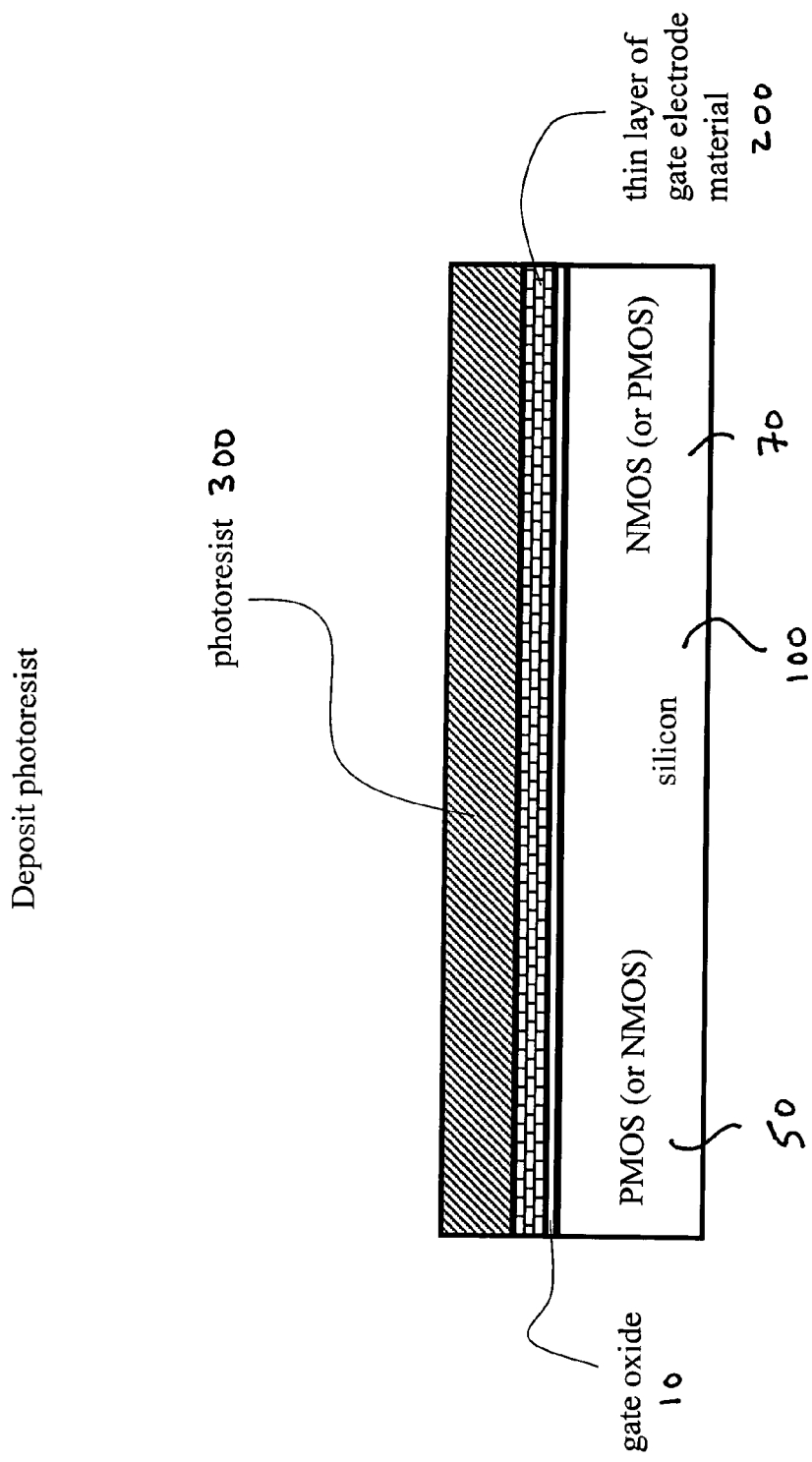
Figure 4:
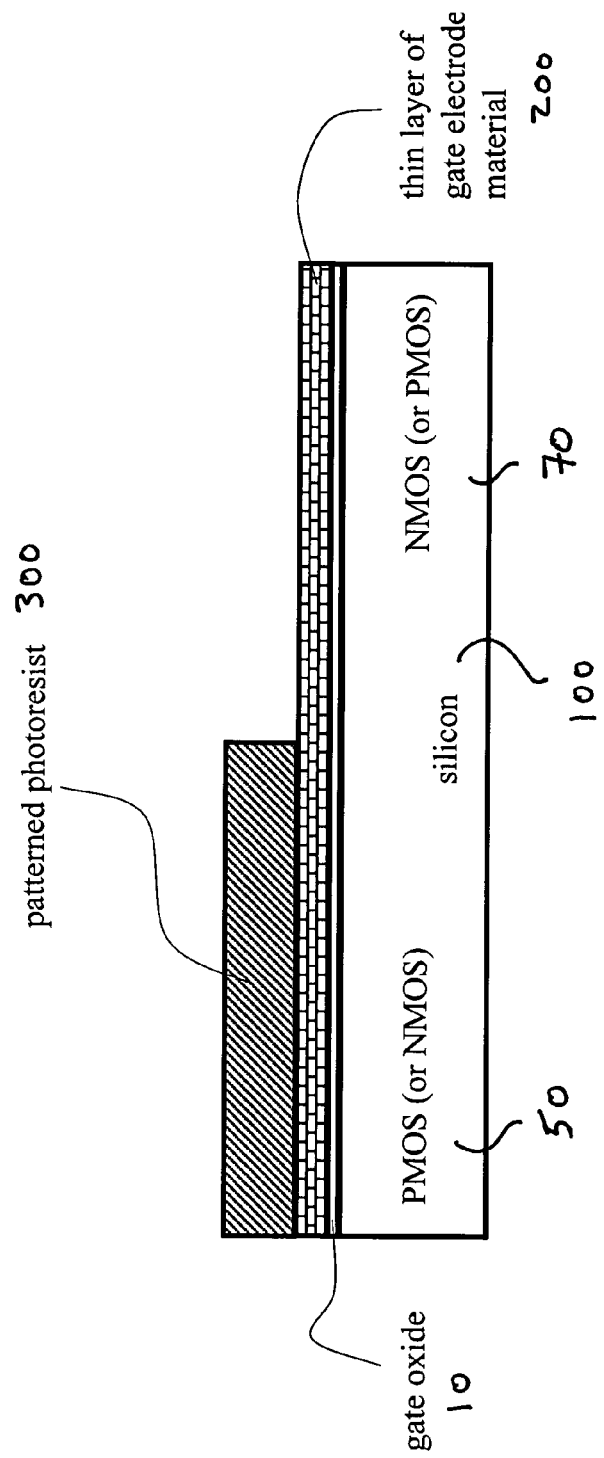

As illustrated in FIG. 3, a mask layer 300, such as a photoresist, is deposited over the barrier layer 200. The mask layer 300 is subsequently patterned, such as by conventional photolithographic techniques, so that it is differentially present over one of the PMOS 50 or NMOS 70 regions, but not both. As illustrated in FIG. 4, the mask layer 300 is left only over the PMOS region 50.

Figure 5:
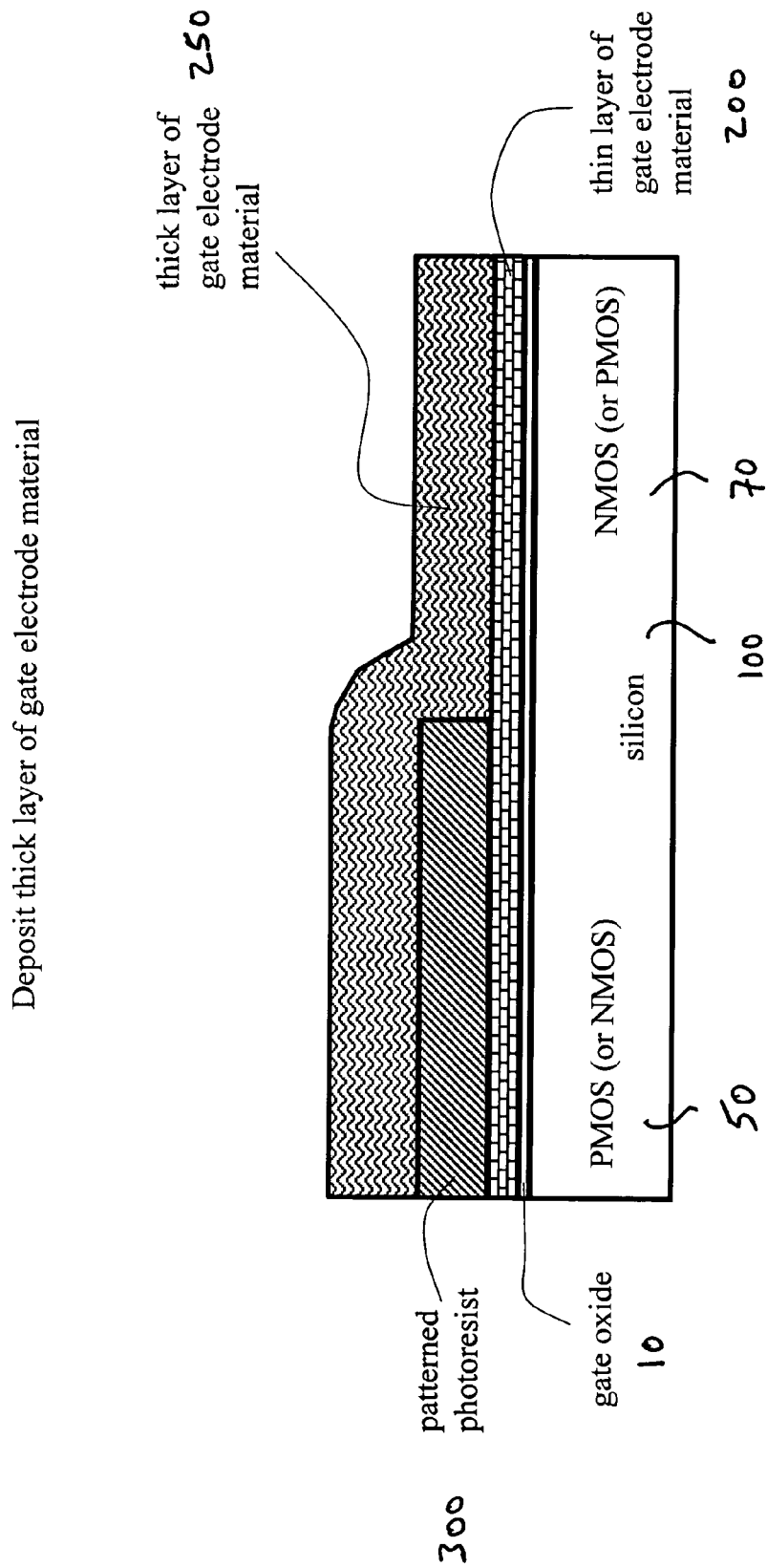

Following patterning of the mask layer 300 a thick layer of gate electrode material 250 is deposited (FIG. 5). The thick layer of gate electrode material 250 may be deposited by any suitable method, such as PVD, CVD or ALD. Preferably the thick layer of gate electrode material 250 is deposited by ALD. The thick layer of gate electrode material 250 is preferably deposited to a thickness from about 50 Å to about 800 Å, more preferably to a thickness from about 100 Å to about 400 Å.

Materials that may be used for the gate electrode are well known in the art, as described above. In one embodiment, the thick layer of gate electrode material 250 is the same material as the barrier layer 200.

Figure 6:
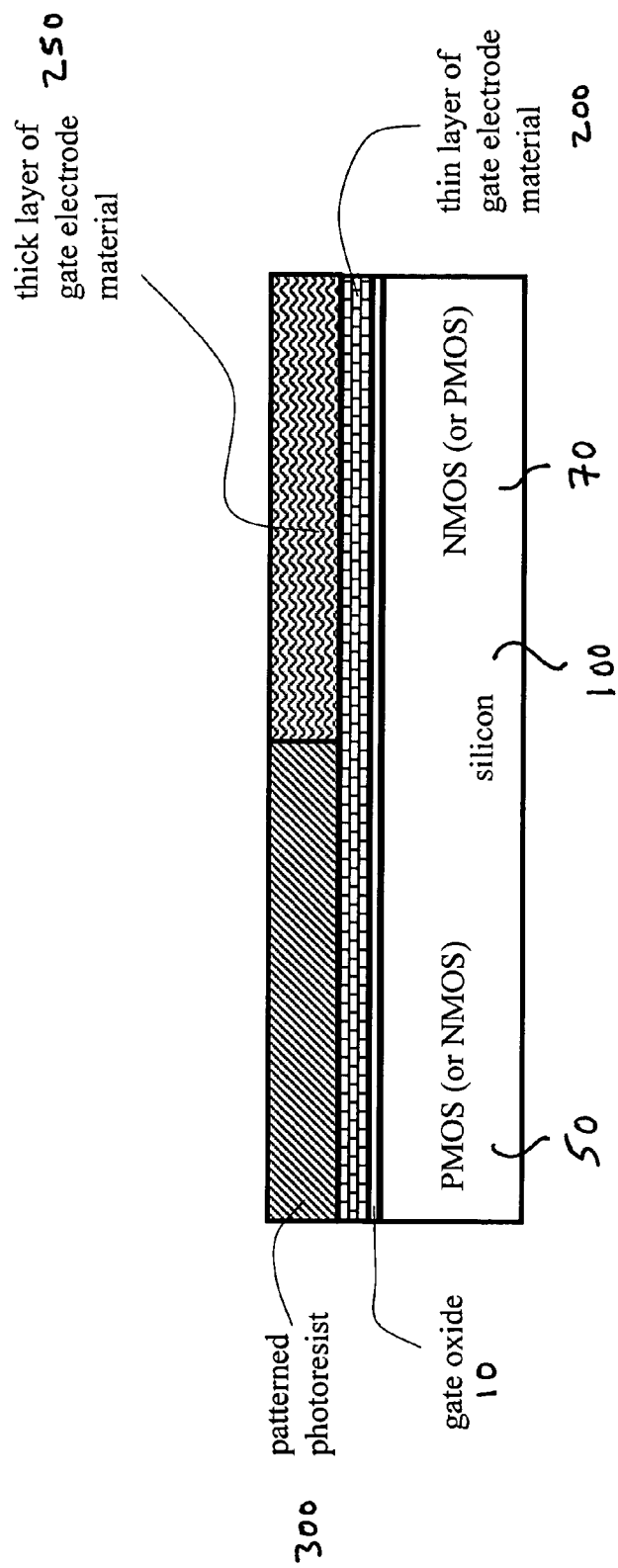

The thick layer of gate electrode material 250 is subsequently planarized or otherwise patterned (FIG. 6) such that a first gate electrode layer 250 is formed over one of the PMOS 50 or NMOS 70 regions, rather than both. As illustrated in FIG. 6, the first gate electrode layer 250 is formed over the NMOS region 70. The first gate electrode layer 250 preferably has a thickness from about 50 Å to about 800 Å, more preferably from about 100 Å to about 400 Å.

Figure 7:
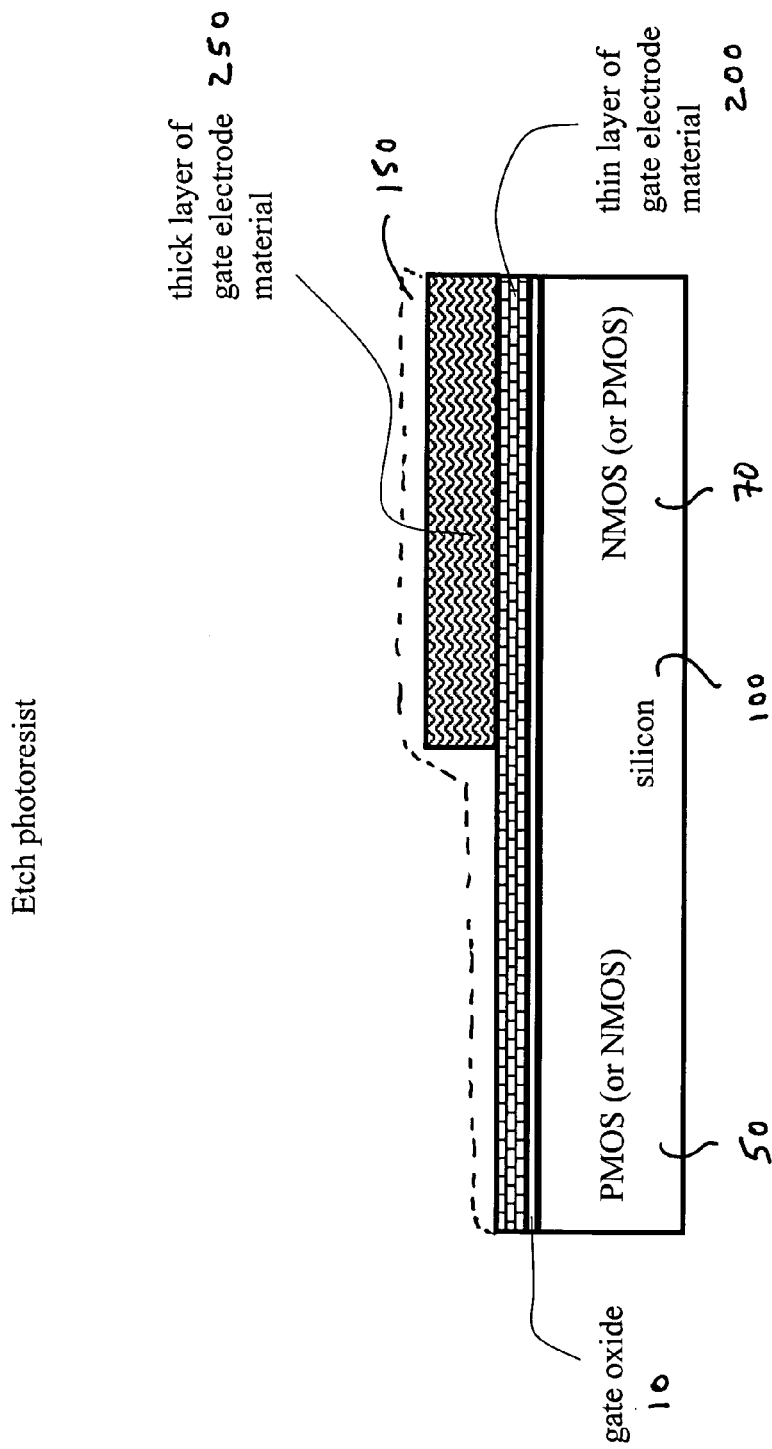

The remaining mask layer 300, which is present over the opposite region, is then removed (FIG. 7). The barrier layer 200 protects the dielectric layer 10 during removal of the mask layer 300, which typically involves treatment with oxygen plasma or ozone ("ashing").

At this point, a thin layer of gate electrode material 150 may optionally be deposited over both the PMOS 50 and NMOS 70 regions (FIG. 7). This second layer may be beneficial to the electrical properties of the transistor because the electrical properties of the transistor are predominately determined by the region within about 100 angstroms of the gate dielectric. Preferably, this thin layer of gate electrode material 150 is deposited by ALD to a thickness from about 3 Å to about 100 Å, more preferably from about 3 Å to about 50 Å.

Figure 8:
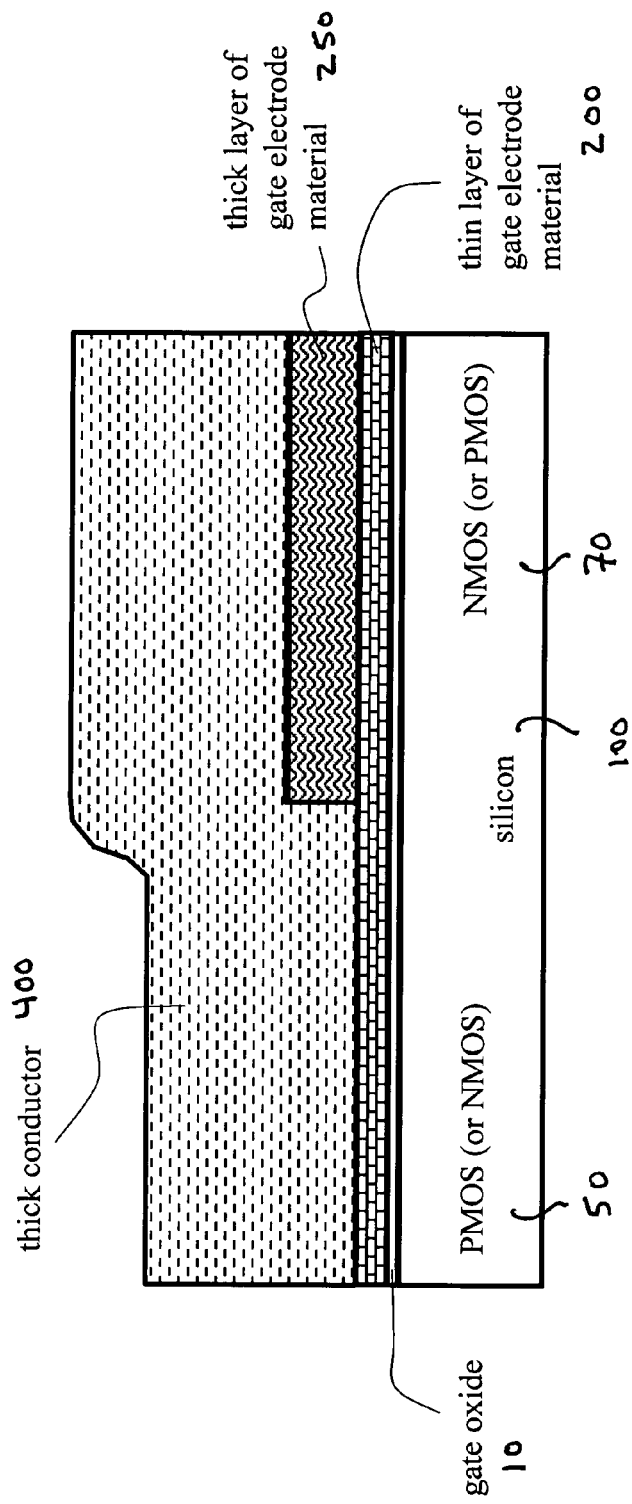

As shown in FIG. 8 a thick layer of conductive material 400 is deposited over both the PMOS 50 and NMOS 70 regions. The thick layer 400 may be comprised of any conductive material known in the art, for example, W, Al, Ni, Ru, $RuO_2$ and poly-Si. Other materials that may be used in the thick layer 400 of conductive material will be apparent to the skilled artisan. The conductive material 400 may be deposited by any suitable method known in the art, such as ALD, CVD or PVD. In a particular embodiment the conductive material is deposited by ALD. The thick layer of conductive material 400 is preferably deposited to a thickness from about 50 Å to about 800 Å, more preferably to a thickness from about 100 Å to about 400 Å.

Figure 9:
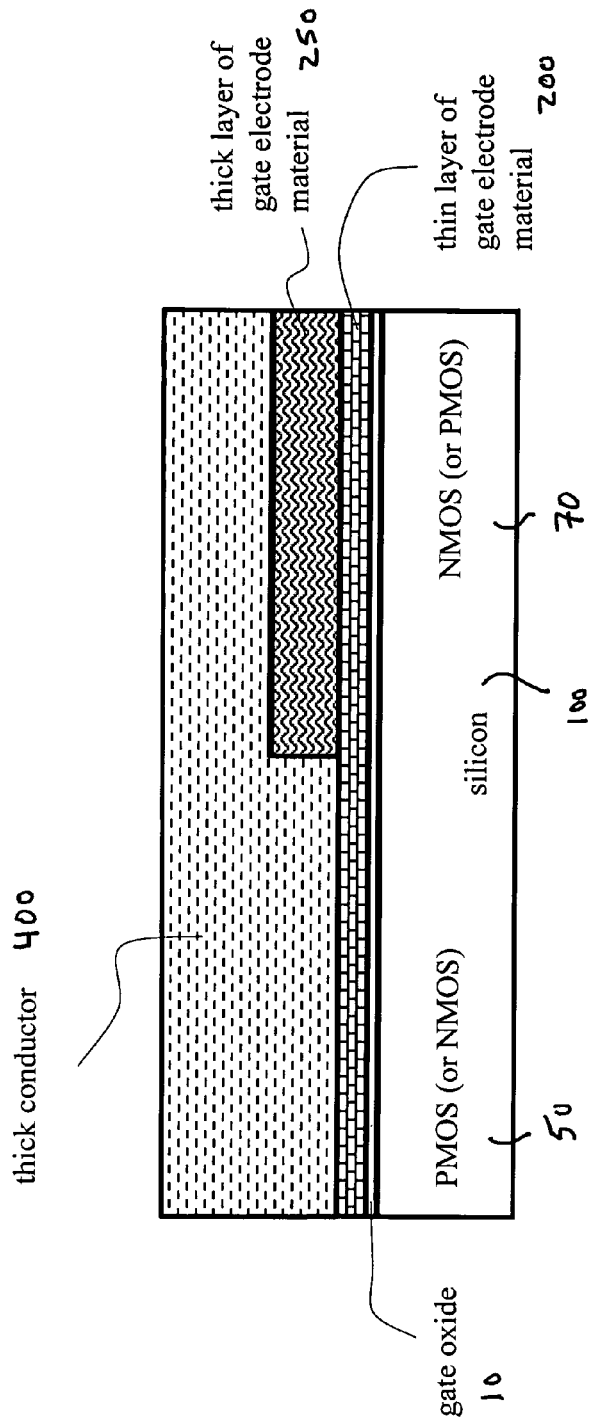

Subsequently, the thick conductive layer 400 is planarized, for example, by chemical mechanical polishing (CMP), as illustrated in FIG. 9 to form the second gate electrode layer 400. FIG. 9 shows the second gate electrode layer 400 formed over the PMOS region 50. The second gate electrode layer 400 preferably has a thickness from about 50 Å to about 800 Å, more preferably from about 100 Å to about 400 Å. The second gate electrode layer 400 preferably comprises a different material from the first gate electrode layer 250. Planarization may be accomplished. The thick conductive layer 400 forms the second gate electrode.

In the resulting gate stack with a thin barrier layer 200 (less than about 50 Å) over the gate dielectric 10, the work function is determined by the material overlying the barrier layer 200. Thus, in the gate stack illustrated in FIG. 9, the work function of transistors in the NMOS region 70 is determined by the first gate electrode layer 250. The work function of transistors in the PMOS region 50 is determined by the second gate electrode layer 400. One of skill in the art will recognize that in the process flow illustrated in FIGS. 1–9, the location of the PMOS 50 and NMOS 70 regions and/or the first and second gate electrode layers can be reversed.

Figure 10:
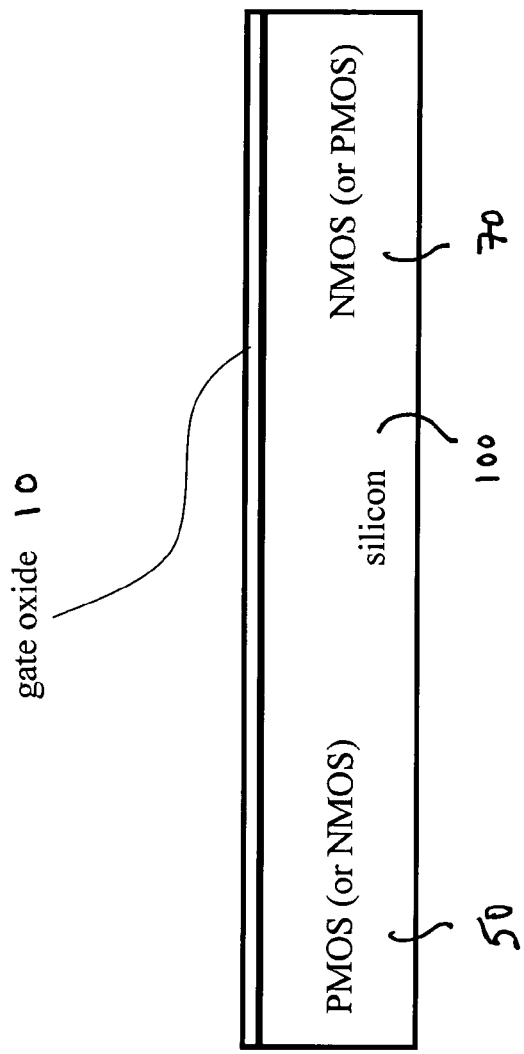
FIGS. 10–18 illustrate steps of a second process flow for the formation of a gate electrode, in accordance with another embodiment of the present invention.
Figure 11:
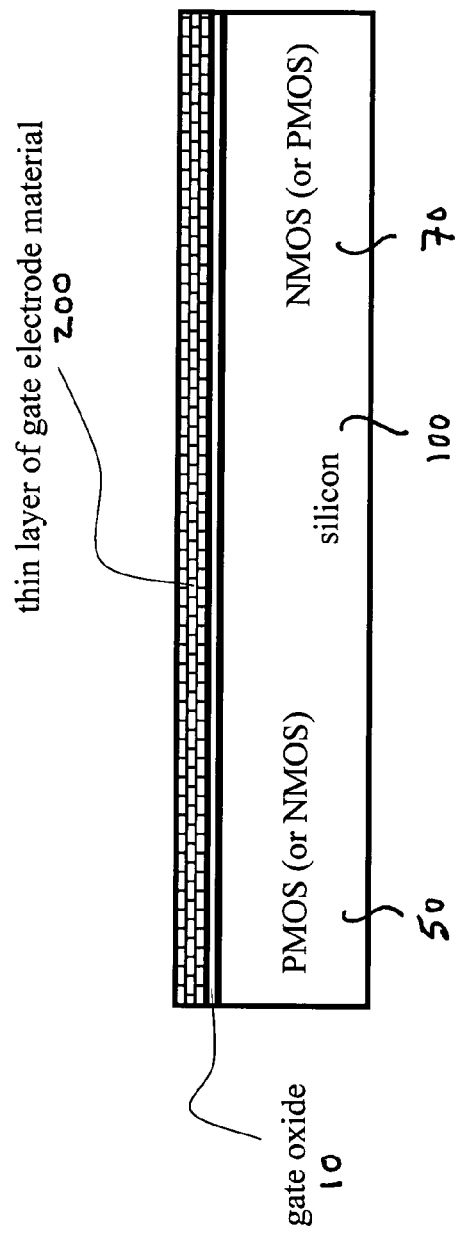

A second process flow is illustrated in FIGS. 10–18. Again, a gate dielectric 10, preferably a gate oxide, is deposited over a substrate 100 comprising a first PMOS transistor region 50 and a second NMOS transistor region 70, as shown in FIG. 10. As in the process flow described above, the locations of the PMOS 50 and NMOS 70 regions may be reversed. A thin barrier layer 200 is deposited over the gate dielectric 10, to form the structure illustrated in FIG. 11. The thin barrier layer 200 may comprise any conductive material, as described above. Preferably, the thin barrier layer 200 having a thickness of less than about 100 Å comprises a gate electrode material.

Figure 12:
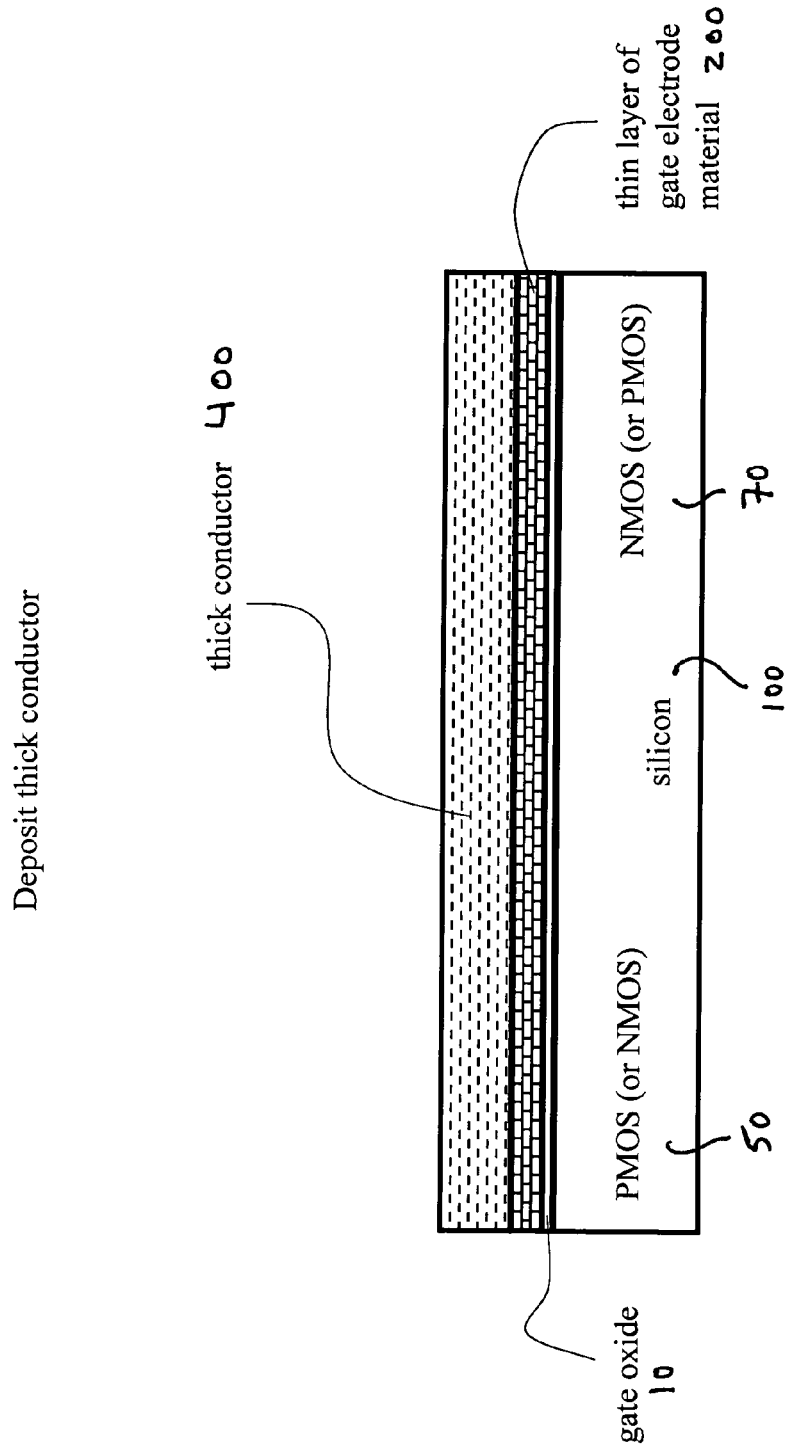
Figure 13:
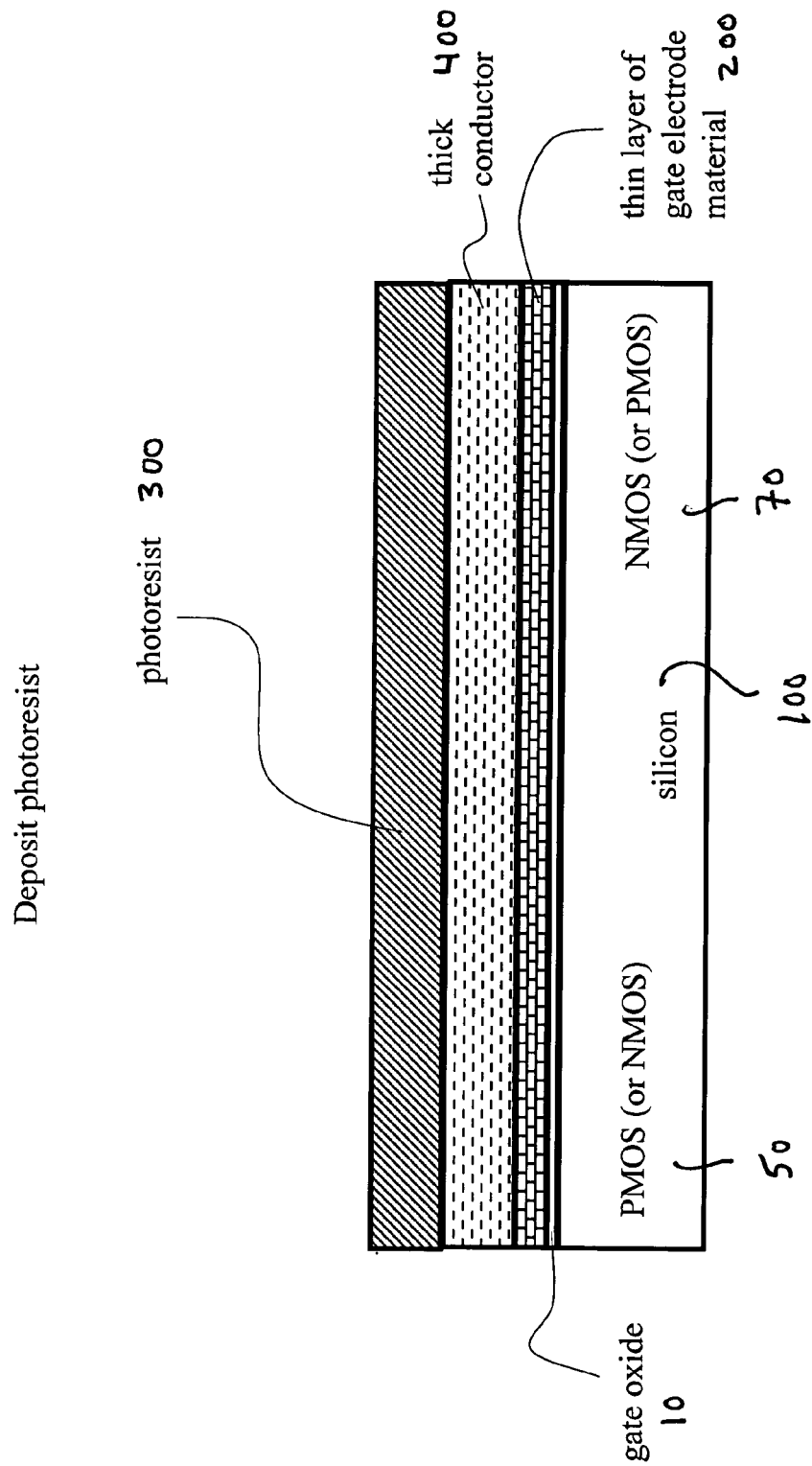

In contrast to the process flow described above, a thick conductive layer 400 is formed over the barrier layer 200. Preferably the thick conductive layer is from about 3 Å to about 800 Å thick, more preferably from about 100 Å to about 400 Å thick. A mask layer 300, such as a layer of photoresist, is formed over the thick conductive layer 400. The resulting structures are illustrated in FIGS. 12 and 13.

Figure 14:
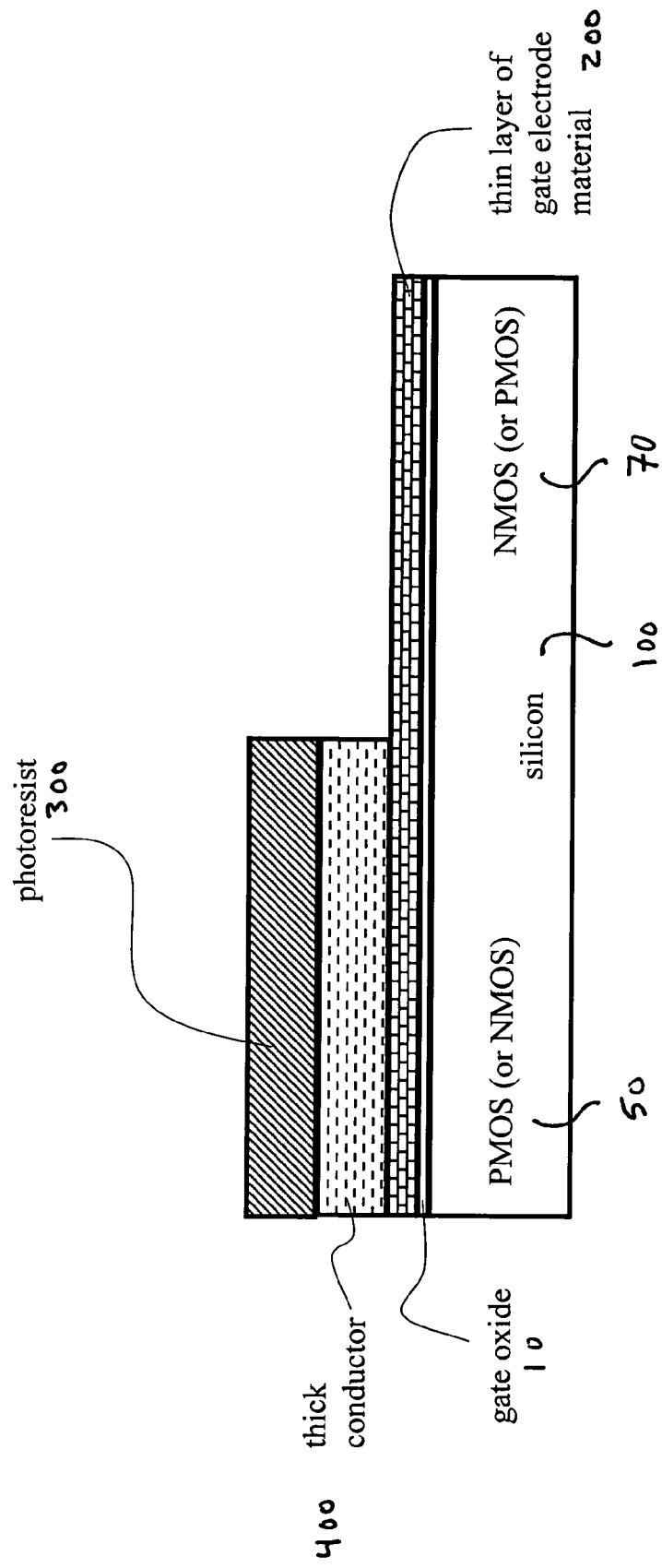

The mask layer 300 is patterned, for example by photolithography, and the thick conductive layer 400 is differentially removed, such as by etching from above the NMOS region 70 but not the PMOS region 50, to form a first gate electrode layer 400 as illustrated in FIG. 14. The barrier layer 200 protects the dielectric layer 10 during the etch process. A selective etch process can be used if the thick conductive layer 400 is a different material from the barrier layer 200. Timed etching or optical end point etching could also be used.

Figure 15:
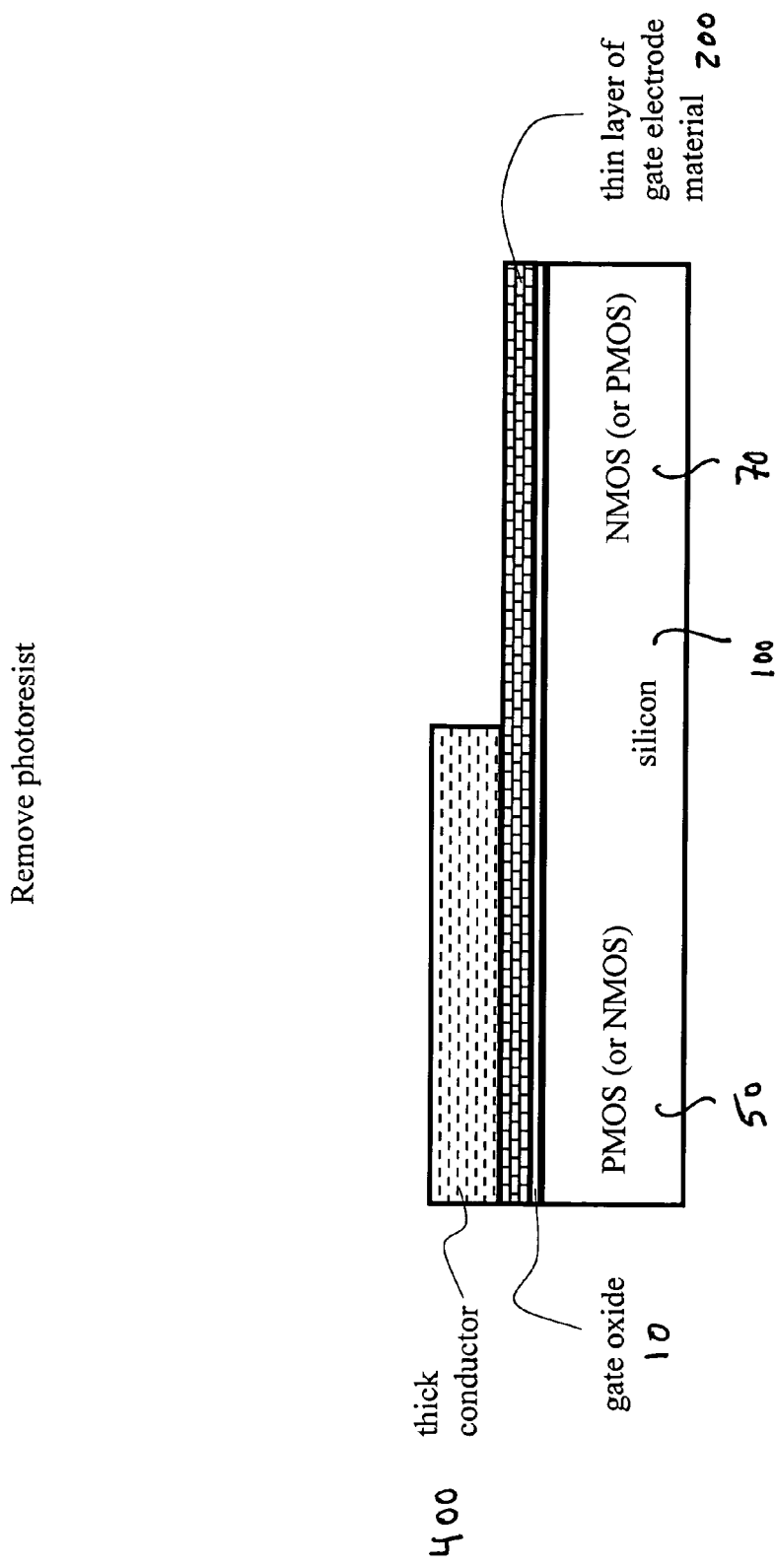

The remaining mask layer 300 is removed, as shown in FIG. 15. For example, treatment with oxygen plasma or ozone may be used to remove the mask layer 300. The barrier layer 200 protects the substrate from oxidation and damage during this process.

Figure 16:
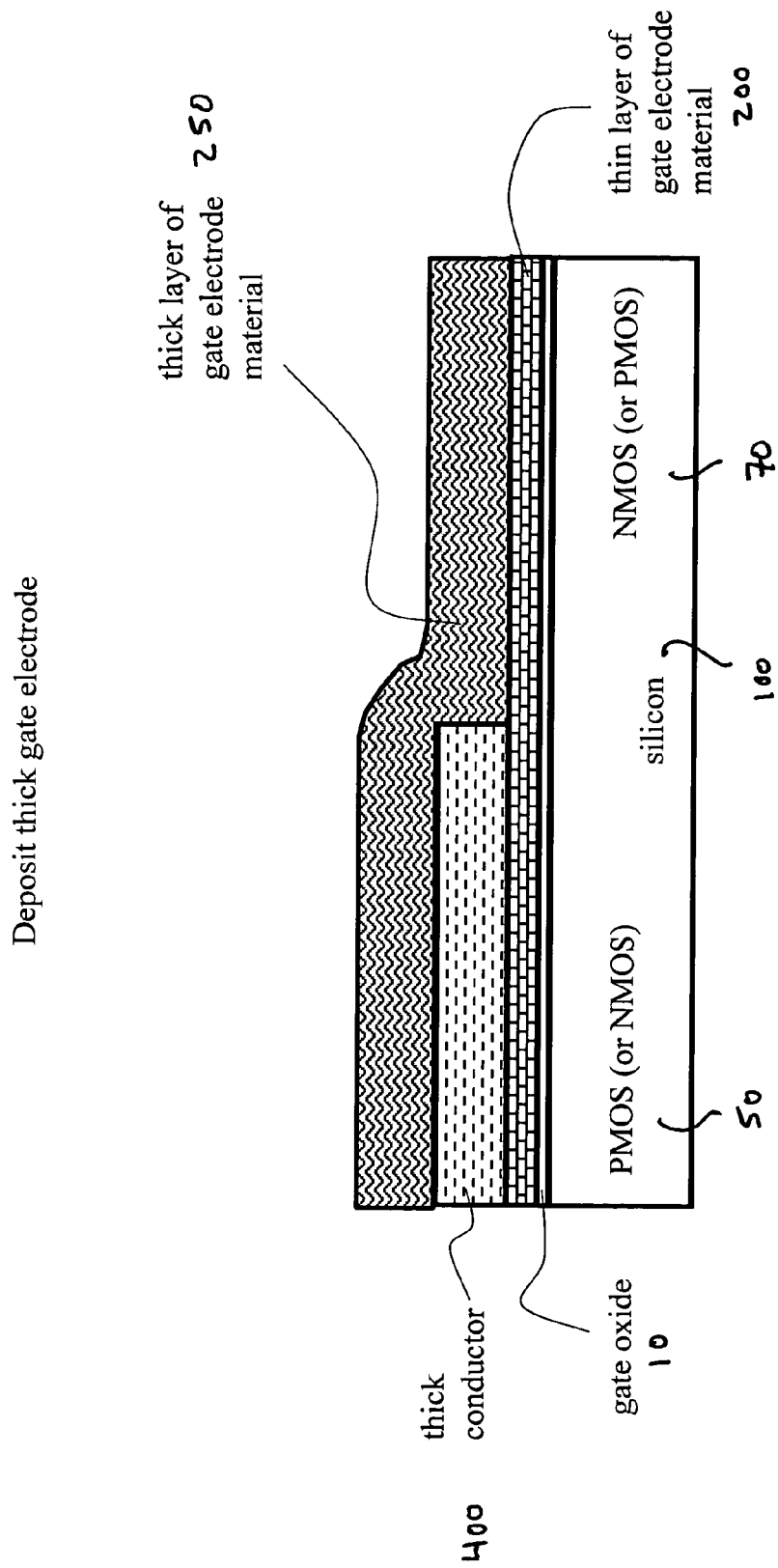
Figure 17:
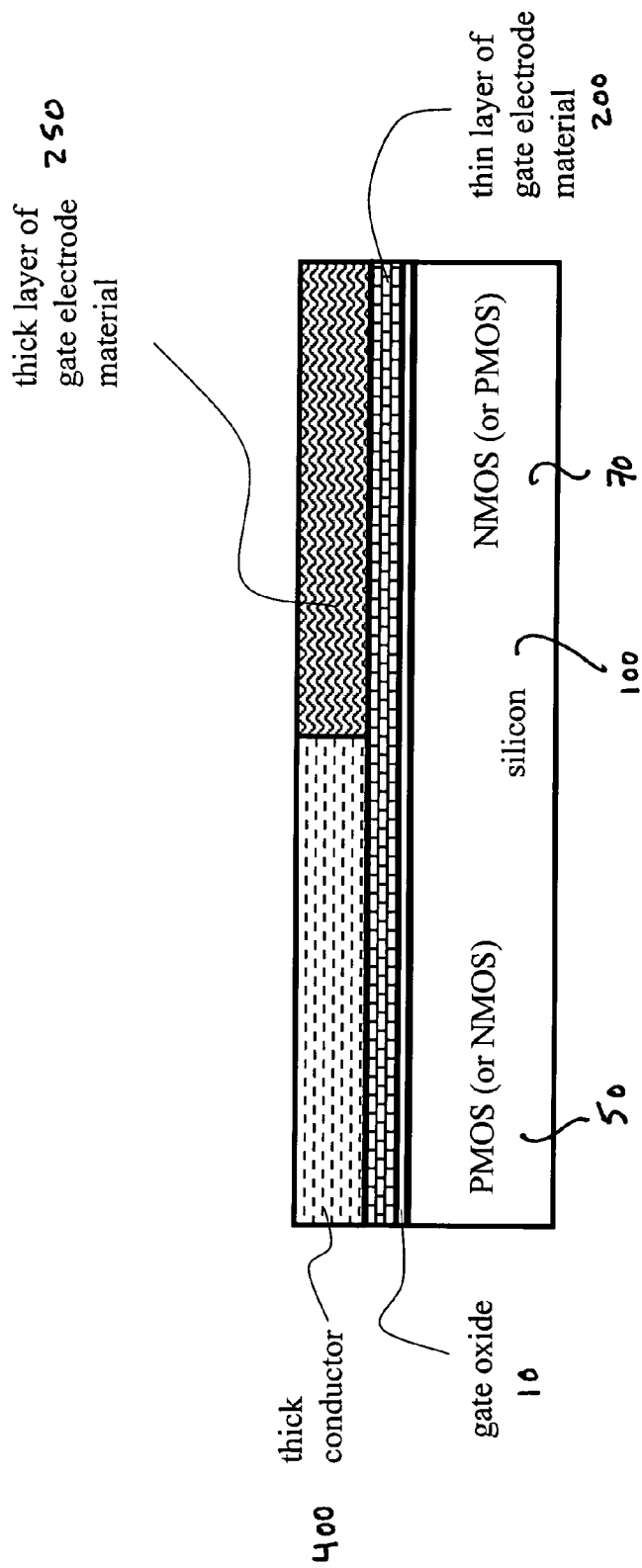

A thick layer of gate electrode material 250 is deposited over both the PMOS 50 and NMOS 70 transistor regions (FIG. 16). Preferably the thick layer of gate electrode material is from about 3 Å to about 800 Å thick, more preferably from about 100 Å to about 400 Å thick. The thick layer of gate electrode material 250 is planarized, such as by CMP, to produce a structure comprising a first gate electrode layer 400 and a second gate electrode layer 250, as shown in FIG. 17.

Figure 18:
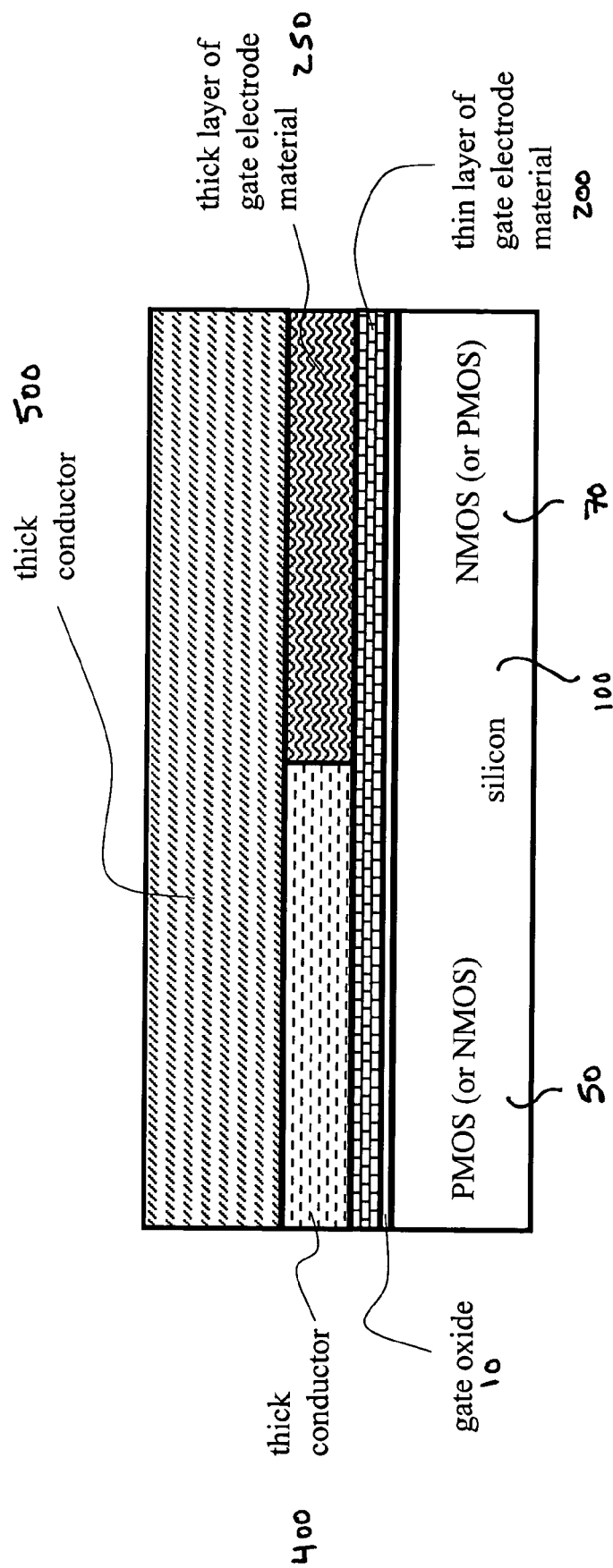
Figure 19:
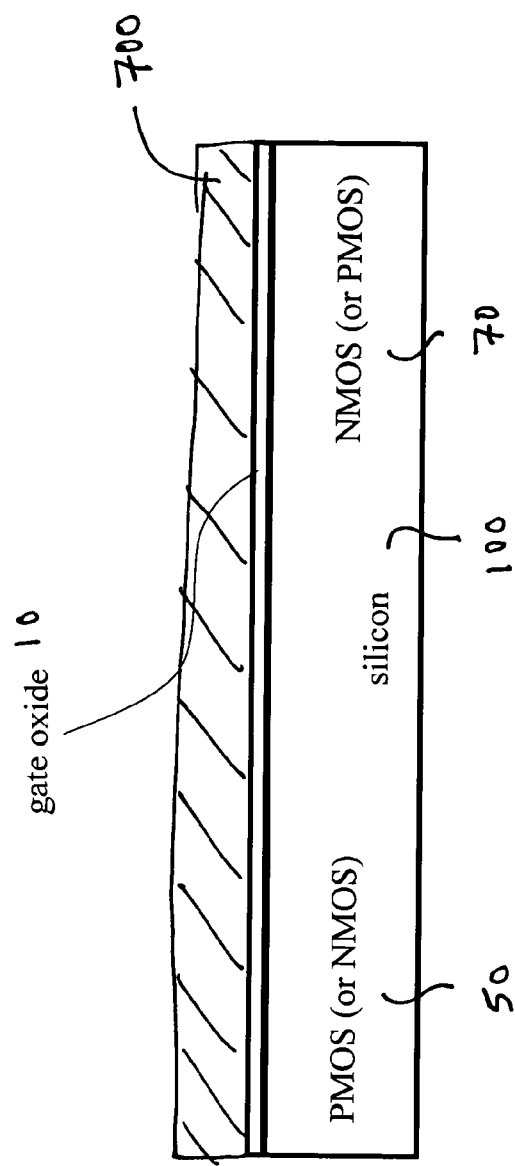
FIGS. 19–22 illustrate steps of a third process flow for the formation of a gate electrode, in accordance with a further embodiment of the present invention.

The process flow is completed by depositing a further thick layer of conductive material 500 over both transistor regions, as illustrated in FIG. 18. The thick layer of conductive material 500 is preferably from about 50 Å to about 800 Å thick, more preferably from about 100 Å to about 400 Å thick.

Figure 20:
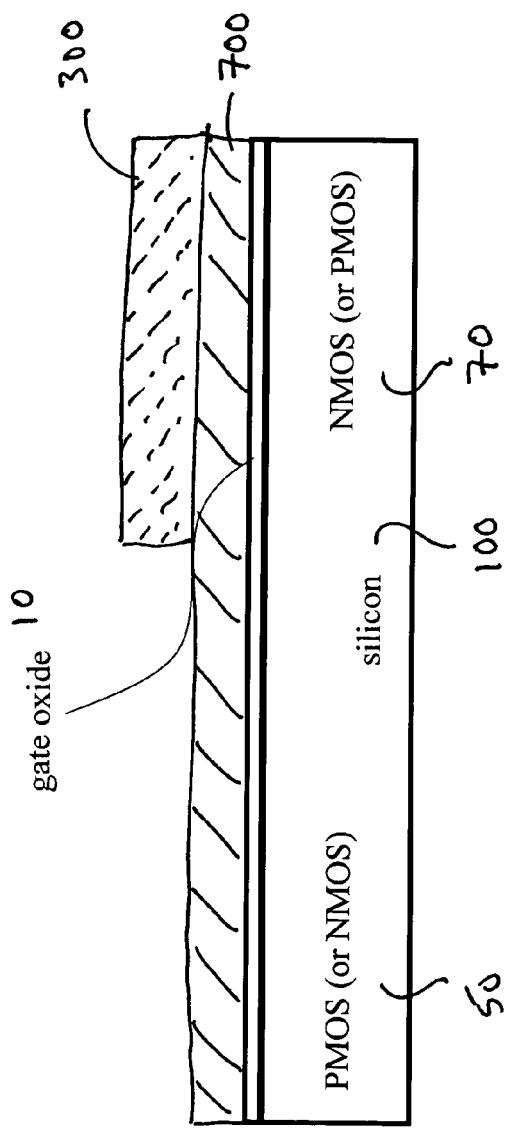

A third process flow is illustrated in FIGS. 19–22. A thick layer of conductive material 700, preferably with barrier characteristics, is deposited over the gate dielectric 10 on a substrate 100 comprising a PMOS region 50 and NMOS region 70 to produce the structure illustrated in FIG. 19. A mask layer 300, such as a layer of photoresist, is deposited over either the PMOS region 50 or NMOS region 70. FIG. 20 illustrates an embodiment in which the mask 300 is deposited over the NMOS region 70.

Figure 21:
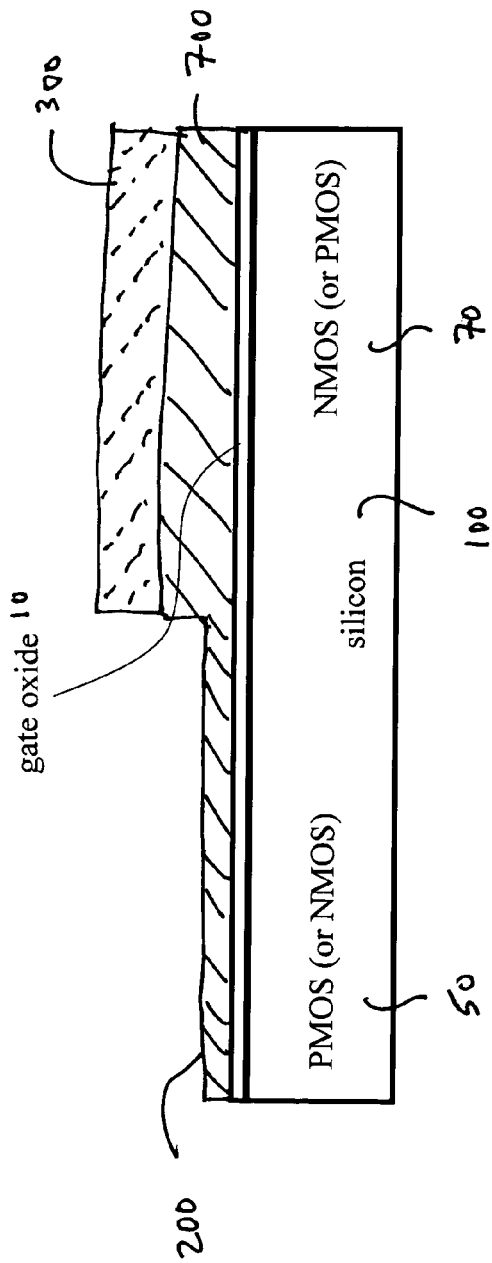

The thick layer of conductive material 700 is etched where it is not masked. The etch is timed such that the dielectric 10 is not exposed and a thin barrier layer 200 is formed over one transistor region, for example the PMOS 50 region as shown in FIG. 21. The remaining thick area under the mask forms a first gate electrode layer 750 over the opposite transistor region, here the NMOS region 70, as illustrated in FIG. 21. Typically, the thin barrier layer 200 is less than about 100 Å, more preferably from about 3 Å to about 50 Å, even more preferably from about 3 Å to about 30 Å.

Figure 22:
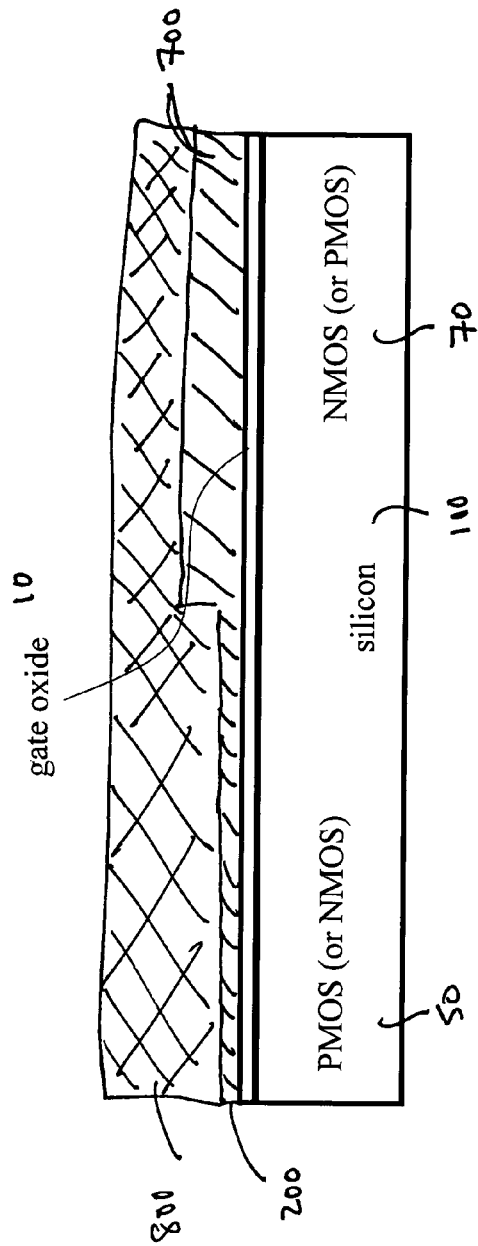
Figure 1:
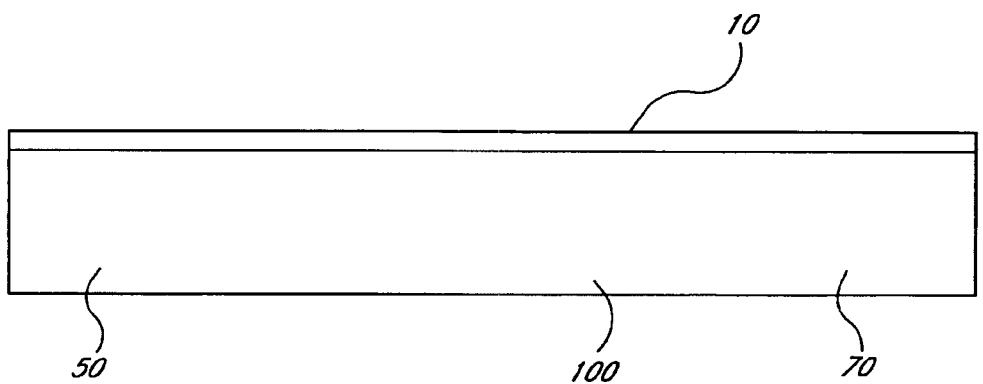
Figure 2:
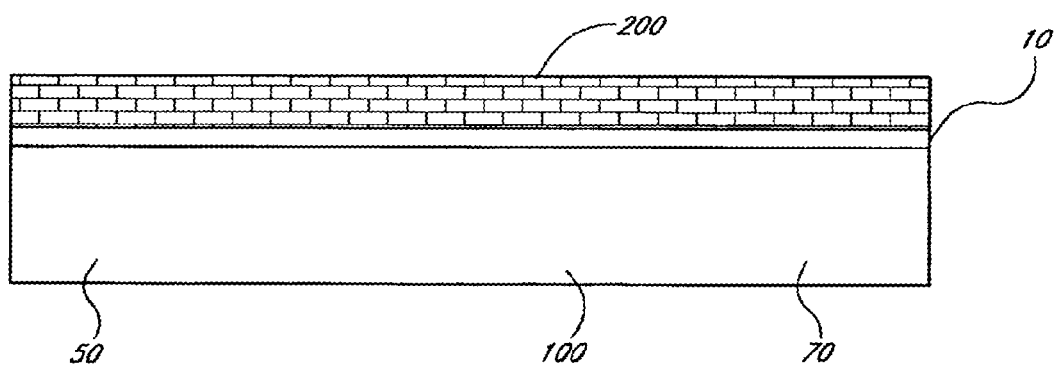
Figure 3:
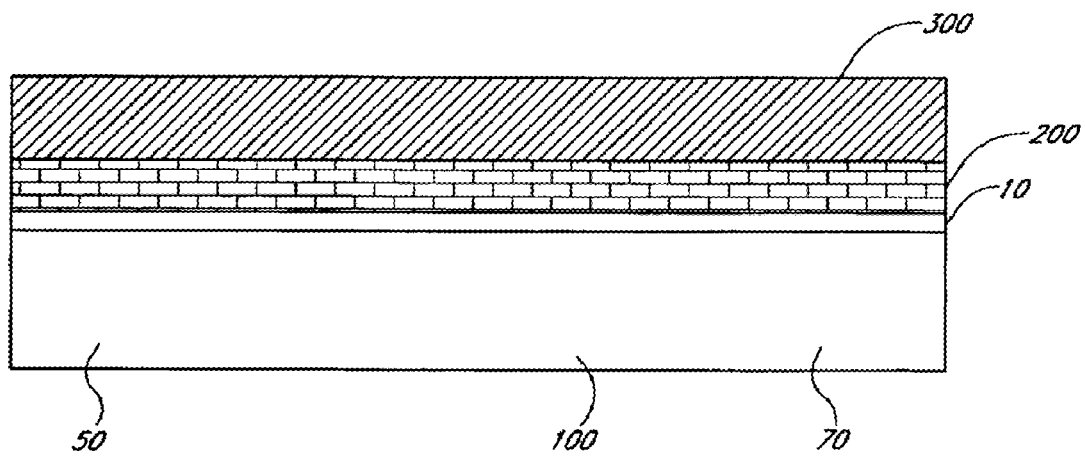
Figure 4:
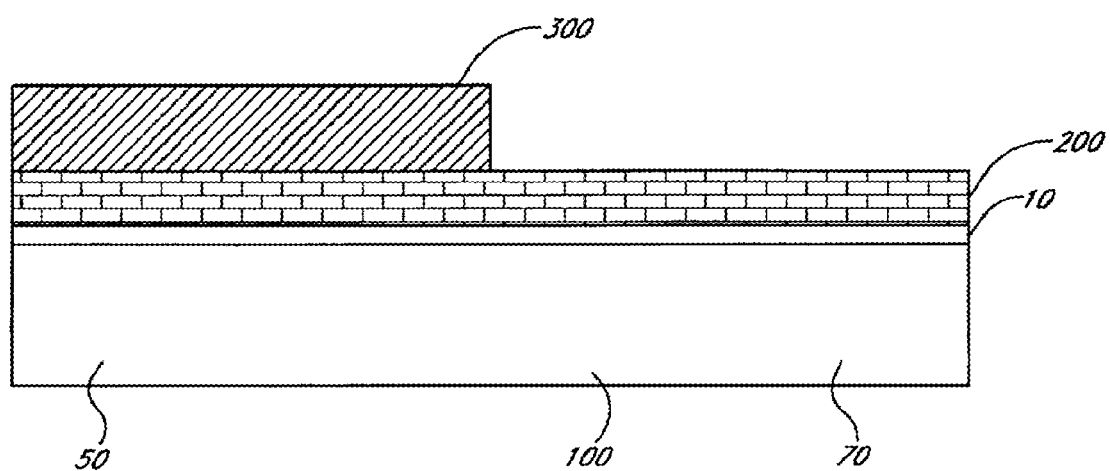
Figure 5:
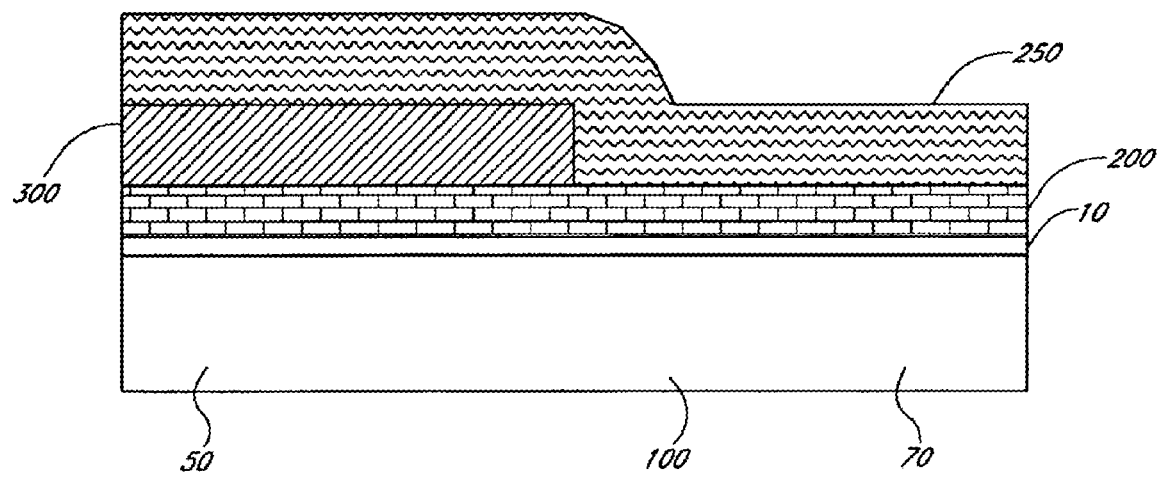
Figure 6:
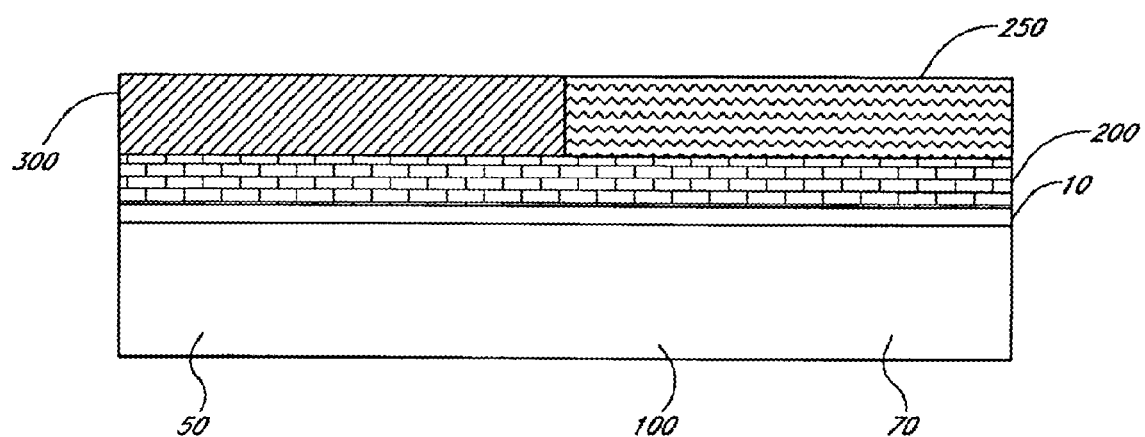
Figure 7:
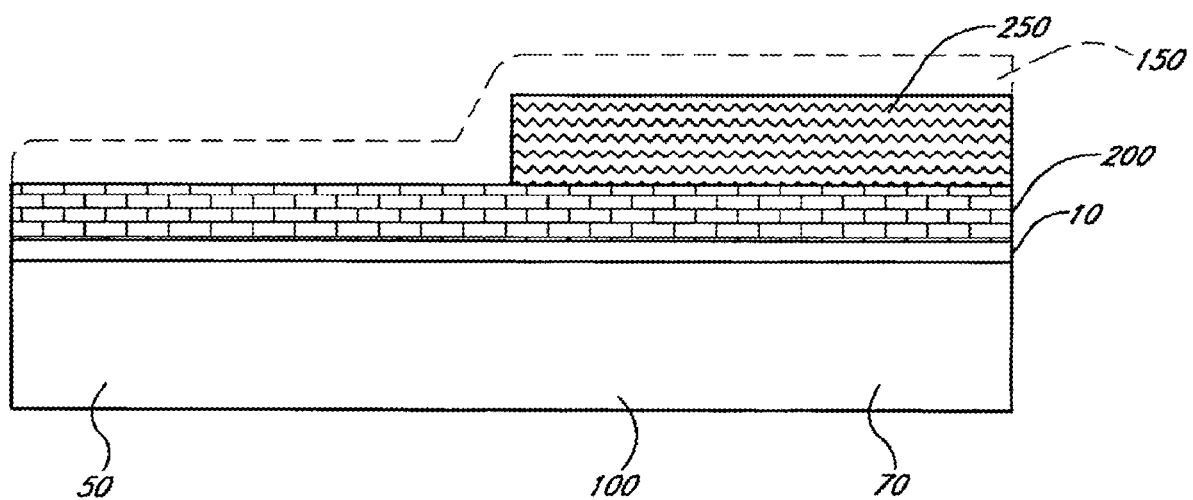
Figure 8:
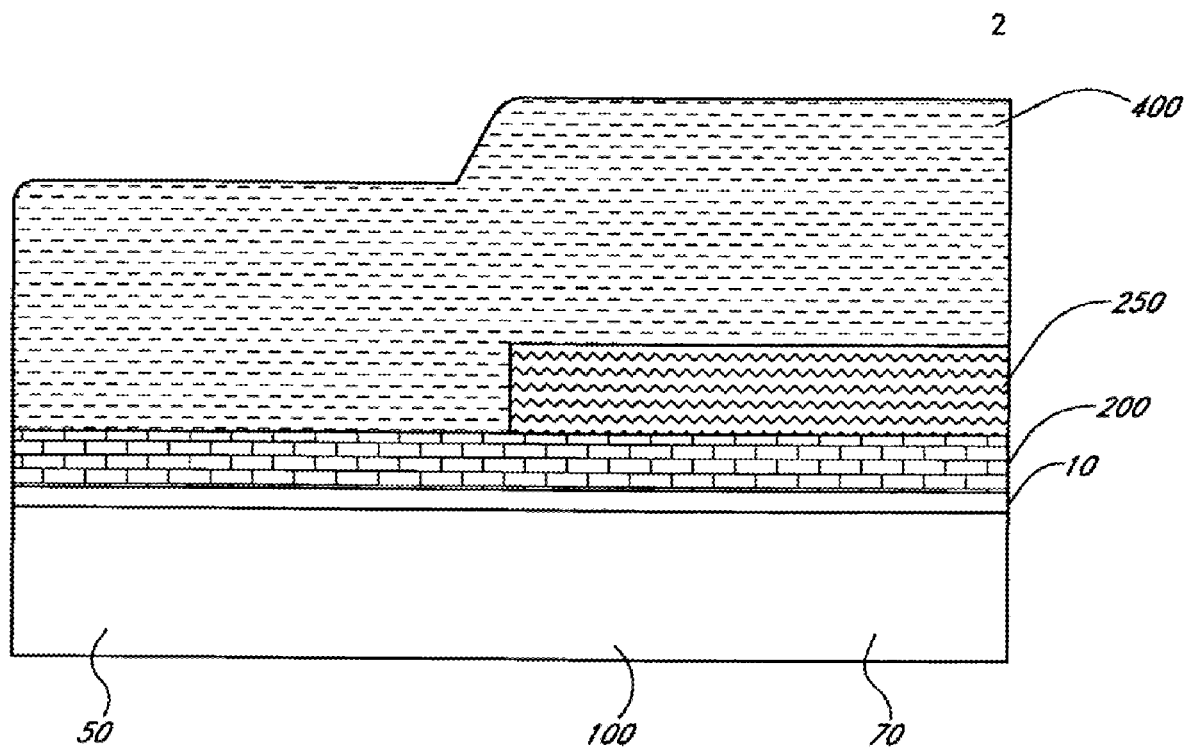
Figure 9:
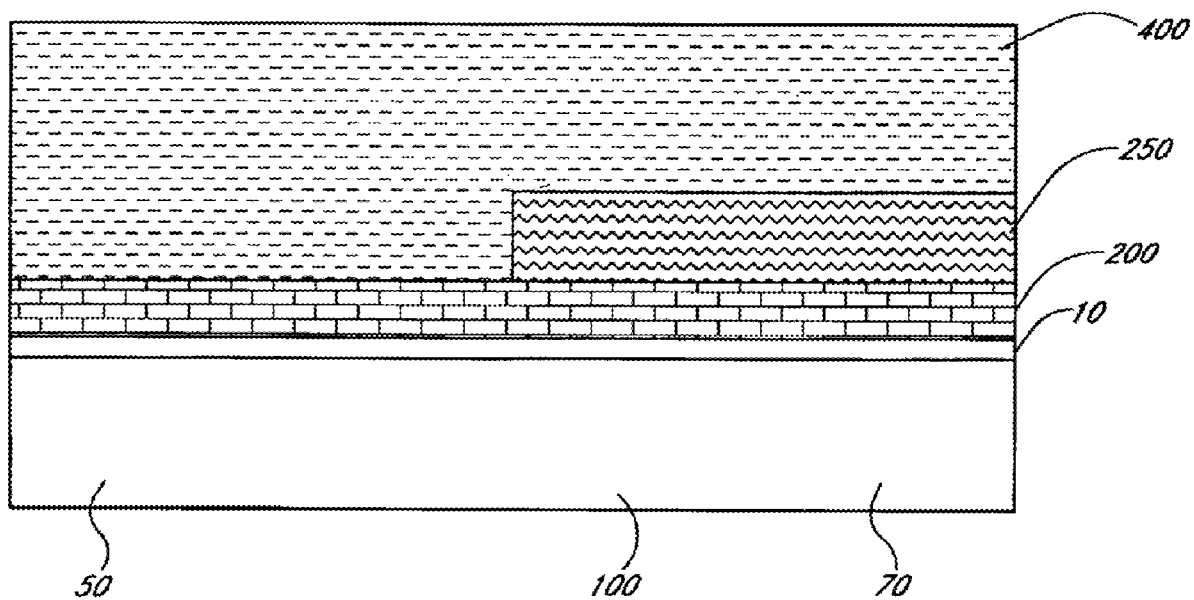
Figure 10:
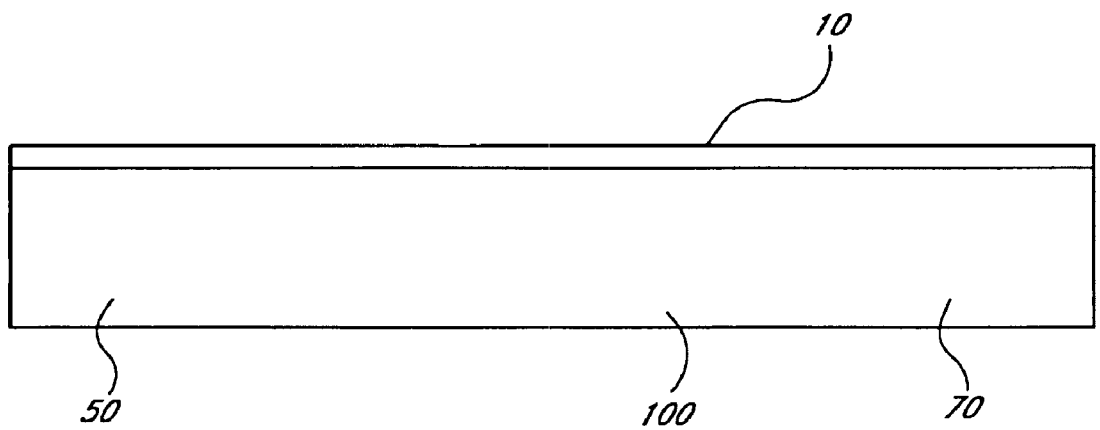
Figure 11:
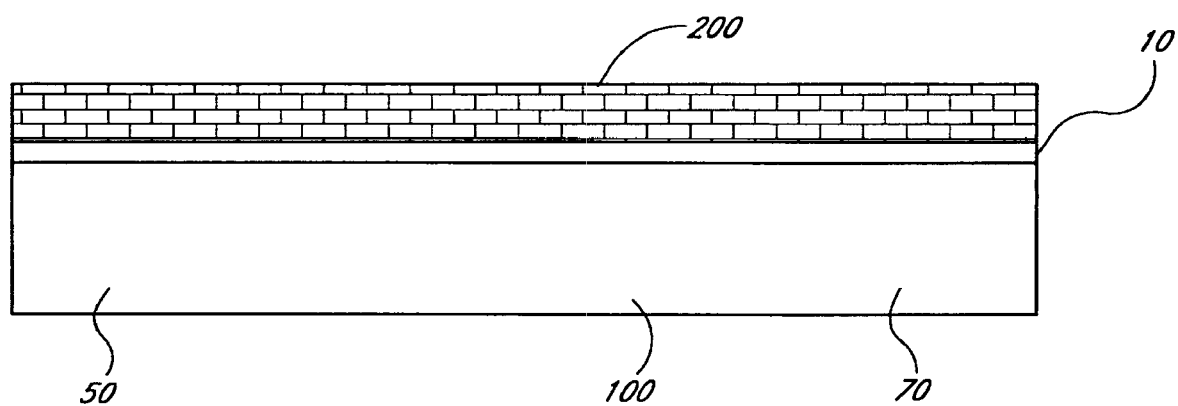
Figure 12:
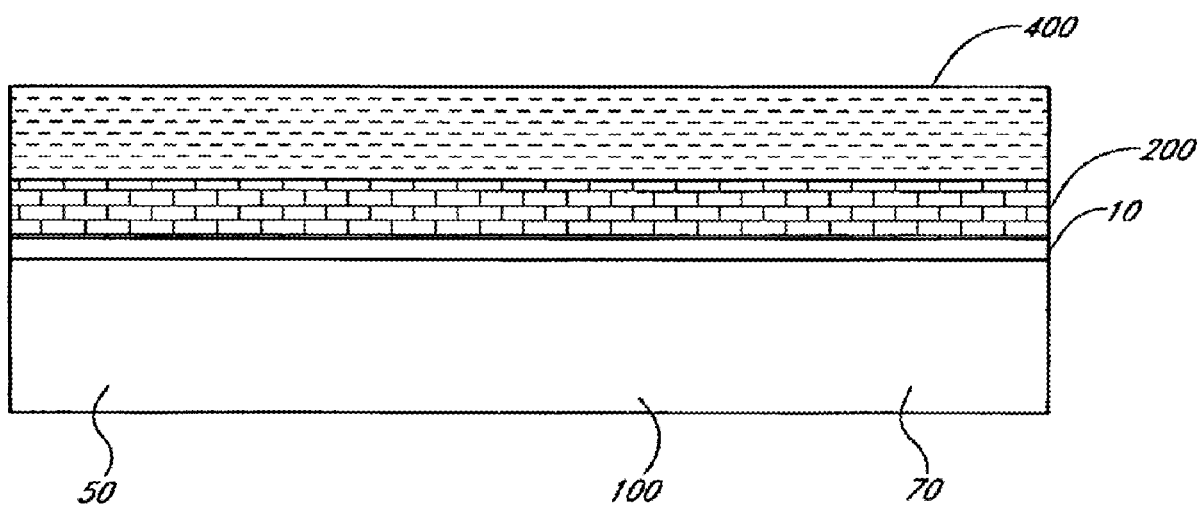
Figure 13:
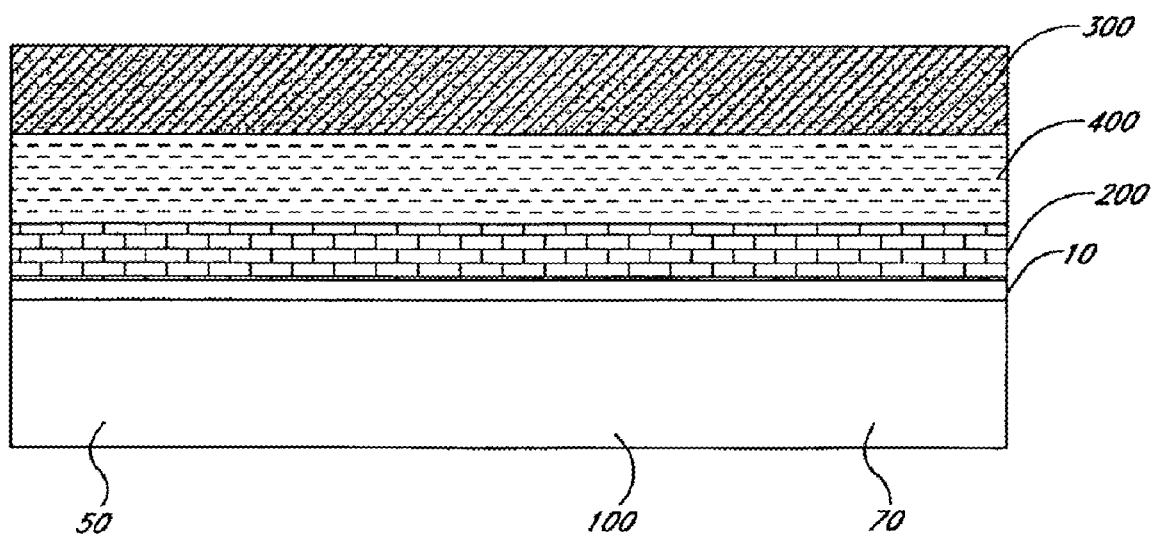
Figure 14:
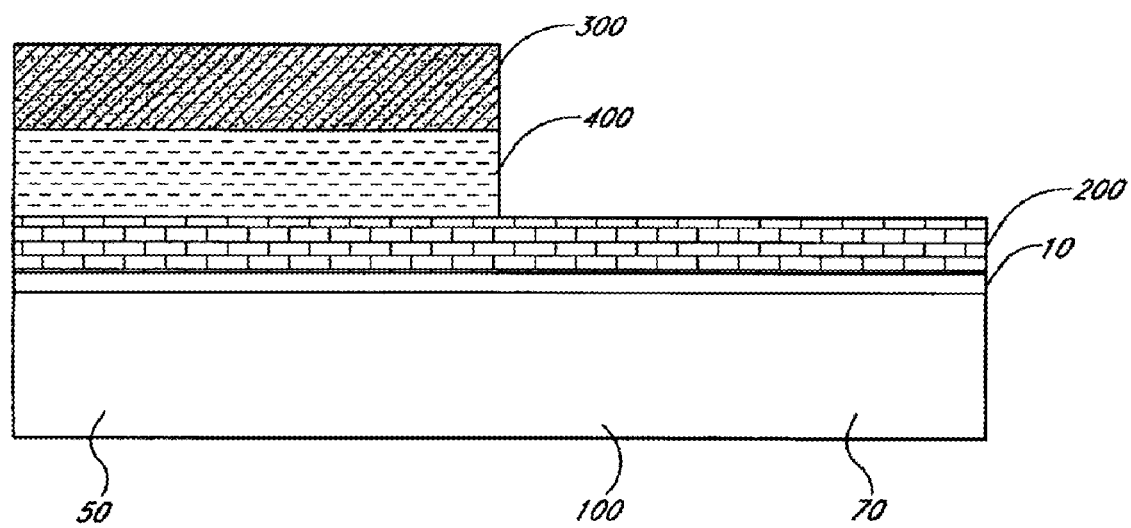
Figure 15:
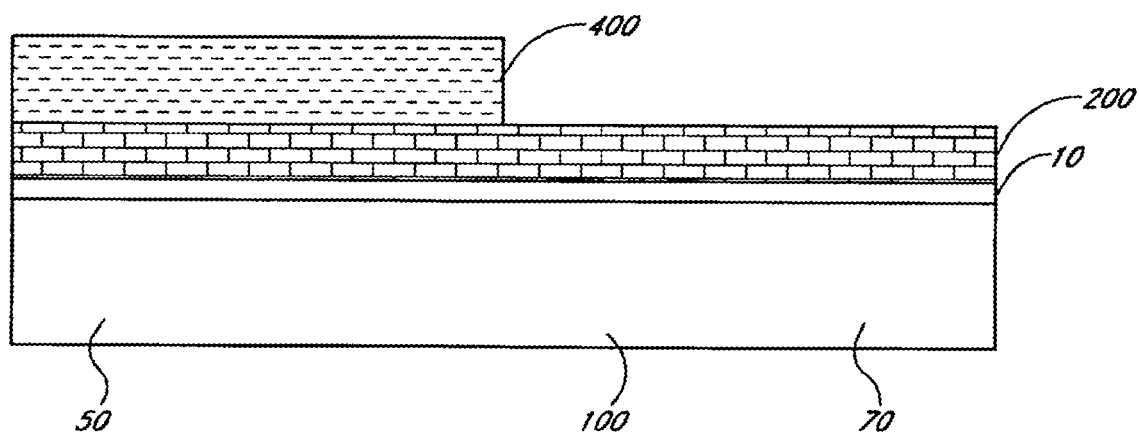
Figure 16:
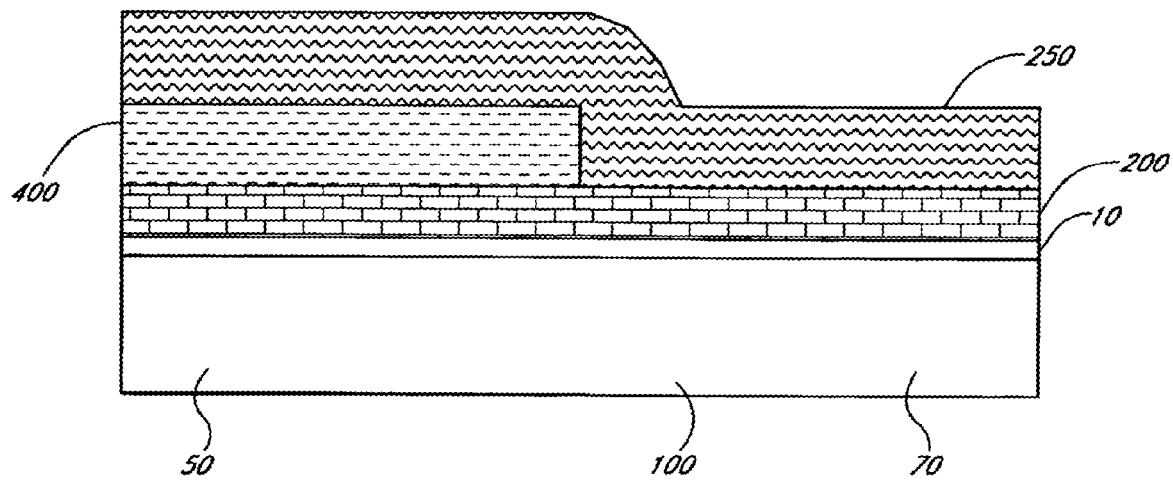
Figure 17:
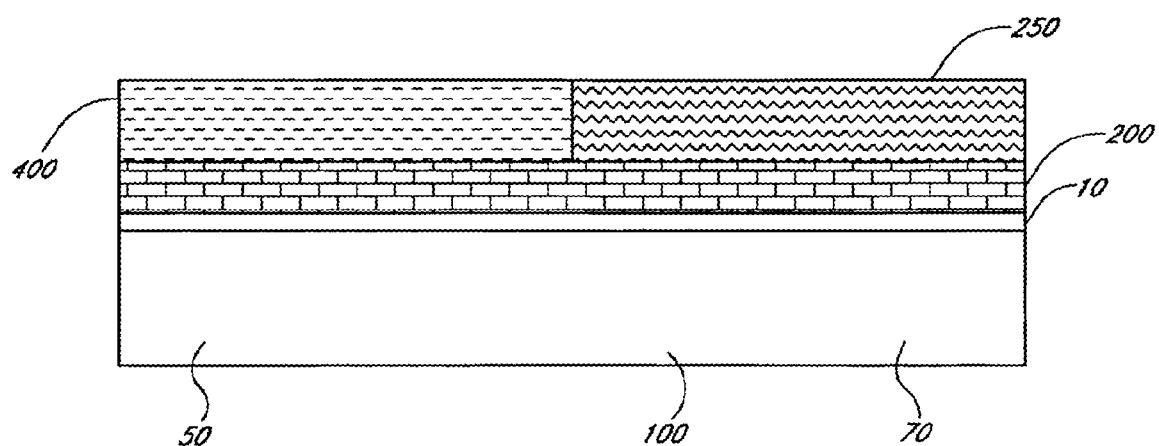
Figure 18:
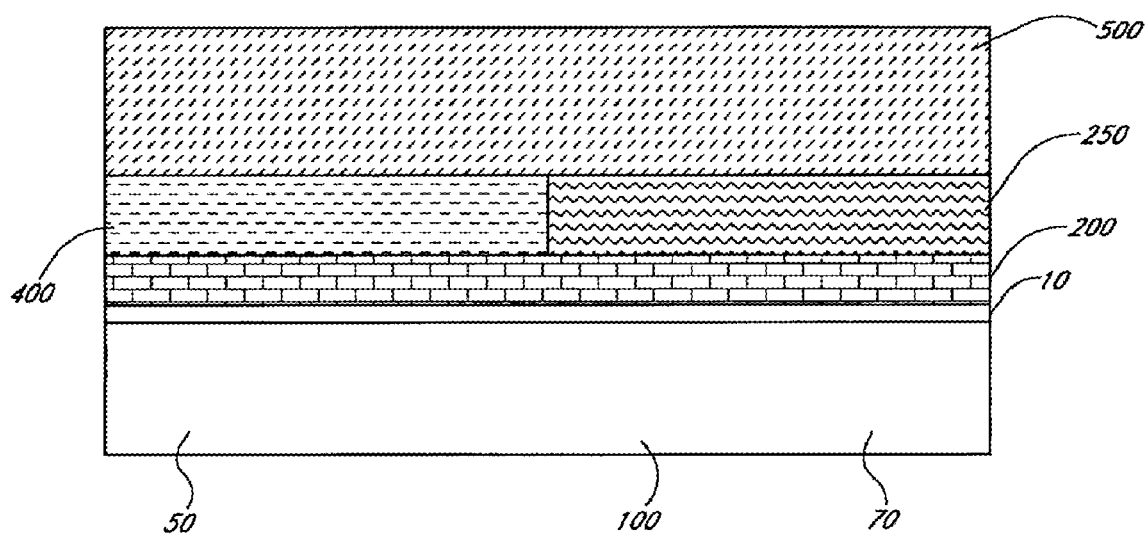
Figure 19:
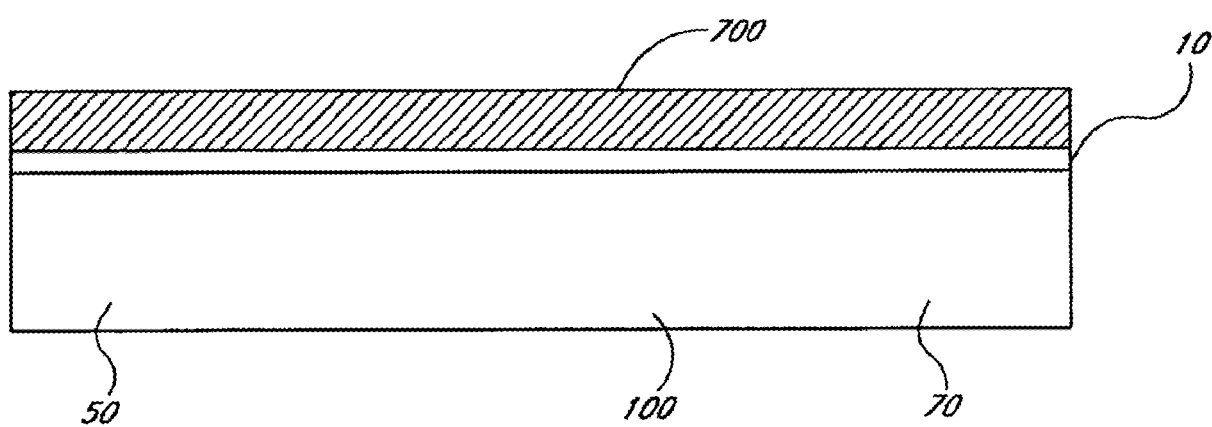
Figure 20:
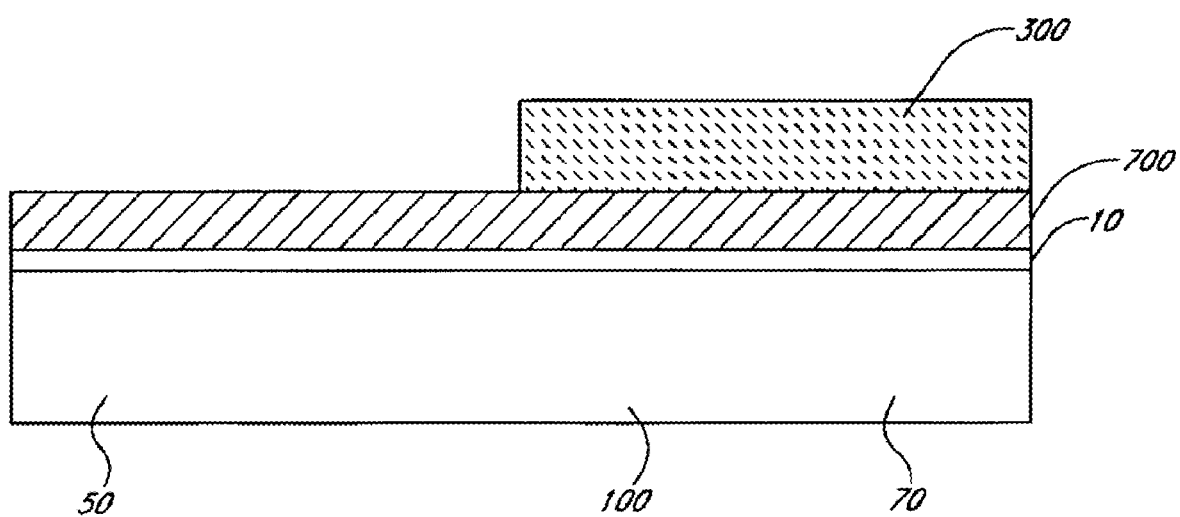
Figure 21:
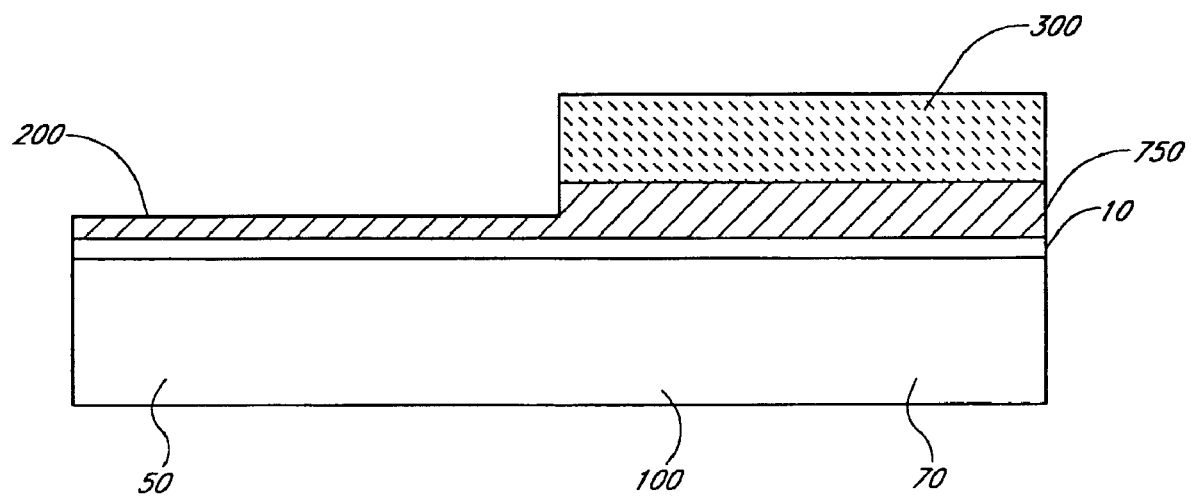
Figure 22:
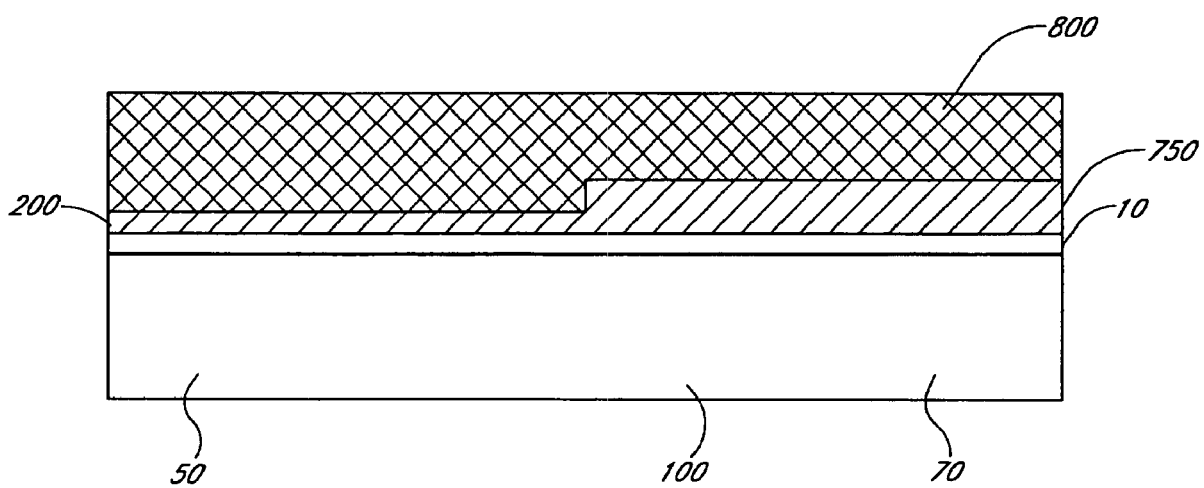

The remaining mask layer 300 is removed from over the first gate electrode 750, such as by treatment with oxygen plasma. The barrier layer 200 protects the underlying dielectric from damage during this process. Subsequently, a layer of gate electrode material 800 is deposited over the PMOS 50 and NMOS 70 regions (FIG. 22). The layer of gate electrode material serves as the second gate electrode layer.

In each process flow, the work function can be tuned to the desired level, preferably to a range from about 4.0 to about 4.2 eV for the NMOS regions and from about 5.0 to about 5.2 eV for the PMOS regions. This may be done by selecting the composition, composition gradient and thickness of each of the layers in the gate stack, including the barrier layer and the first and second gate electrode layers.

Each of the layers in the described process flows may be deposited by any method known in the art. Preferably, however, at least one of the layers is deposited by atomic layer deposition.

After forming a gate stack, for example by one of the process flows described above, the electrodes of the CMOS transistors are defined with lithography. Etching of the gate electrodes is simplified because the barrier layer overlies both the PMOS and NMOS regions. Thus, the same material is present over both CMOS transistor regions and a differential etch can be avoided. In one embodiment, an etch through the overlying materials stops on the barrier layer. A less harmful etch process can then be used to remove the thin barrier layer from over the gate dielectric.

Further, the barrier layer deposited in each of the disclosed process sequences protects the gate dielectric from etch or sputter damage, such as during subsequent PVD deposition of upper metal electrode layers and during oxygen-containing processes, such as photoresist ashing.

In one embodiment the barrier layer is deposited in the same reaction space as the dielectric layer. "Reaction space" designates a reactor or reaction chamber in which the conditions can be adjusted so that deposition of the thin layer of gate electrode material by ALD is possible. Preferably the barrier layer is deposited immediately after the dielectric layer. Thus, in a particular embodiment, the barrier layer is deposited by ALD immediately after the deposition of the dielectric layer in the same reaction space.

Pre-Deposition Treatment

If the dielectric material comprises an oxide, for example hafnium dioxide ($HfO_2$) deposited by ALD, the surface of the dielectric layer will comprise hydroxyl groups. If the subsequent deposition of a gate electrode material is begun by introduction of a metal source chemical pulse, a molecular layer of metal oxide (typically different from the material selected for the gate dielectric) will grow on the surface and the equivalent oxide thickness of the dielectric layer will increase. This is a non-limiting example of a situation in which treatment of the dielectric layer prior to deposition of the barrier layer may be beneficial.

In one embodiment an oxide dielectric layer is treated to replace OH groups on the surface with N, NH and/or $NH_2$ groups prior to deposition of a barrier layer, such as a thin layer of gate electrode material. Following such treatment the first metal source chemical pulse will react with the NH and/or $NH_2$ groups on the surface and a molecular metal nitride layer will grow on the surface of the dielectric layer. As a result, the equivalent oxide thickness of the high-k layer does not increase. This treatment is particularly advantageous where the barrier layer is a metal nitride.

In a particular embodiment a high-k oxide surface is treated with ammonia ($NH_3$) gas. Preferably, the treatment is continued for over 1 second, preferably for about 10 seconds to about 60 seconds, at a temperature over about 300° C., preferably at a temperature from about 300° C. to about 450° C.

The pre-deposition treatment may be part of the process by which the gate electrode material is deposited. For example, if $NH_3$ pulses are utilized in an ALD process. The process may be started with a pulse of $NH_3$, thus replacing the surface OH groups with NH and/or $NH_2$ groups. Preferably the first $NH_3$ pulse is longer than the subsequent $NH_3$ pulses. The first $NH_3$ pulse is preferably greater than about 10 seconds, more preferably greater than about 30 seconds, and in one embodiment is about 60 seconds in length. Subsequent $NH_3$ pulses are preferably of shorter duration to minimize deposition time. Preferably subsequent $NH_3$ pulses are from about 0.05 to about 5 seconds, more preferably from about 0.05 to about 2 seconds.

According to another embodiment the high k oxide surface is treated with radicals. In a particular embodiment the dielectric is treated with nitrogen/hydrogen plasma, for example for about 60 seconds. In case of radicals the substrate can also be heated to temperatures lower than about 300° C. In another embodiment, the high-k oxide surface is treated with NH or $NH_2$ radicals. The radicals may be generated, for example, from hydrazine. Surface treatment of high-k dielectrics prior to conductor deposition is described, for example, in U.S. patent application Ser. No. 09/944,734, which is hereby incorporated by reference.

EXAMPLE 1

Hafnium dioxide (3–5 nm) was deposited by ALD on native oxide on a silicon substrate. Hafnium dioxide thin films were deposited at 300° C. on top of native oxide or thin chemical silicon oxide made with IMEC-clean®, commonly available from IMEC VWZ, Belgium, using hafnium chloride and water as reactants.

Titanium nitride (TiN) thin films were deposited on top of the atomic layer deposited hafnium dioxide thin films. The TiN thin films were deposited in a Pulsar®2000 ALCVD™ Reactor (ASM Microchemistry Oy).

In one set of experiments the TiN was deposited from titanium tetrachloride ($TiCl_4$) and ammonia ($NH_3$). In another set of experiments TiN was deposited by in situ plasma enhanced atomic layer deposition (PEALD) using $TiCl_4$ and nitrogen/hydrogen plasma. Titanium nitride thin films were deposited at 350° C. from $TiCl_4$ and $NH_3$ in a standard ALD reaction or from $TiCl_4$ and nitrogen/hydrogen plasma at 250° C. The films were characterized using standard techniques.

The average growth rate of titanium nitride deposited by ALD was 0.02 nm/cycle. Films were very uniform and had a stoichiometry of $TiN_{1.10}$. There was about 0.5 to 3 atomic-% residual chlorine in the films. Films were oxidized in the air up to a depth of approximately 25 nm, with a resulting oxygen concentration of about 30 atomic-% at the film surface. In the bulk film the oxygen concentration was below the detection limit of TOFERDA (Time of Flight Elastic Recoil Detection Analysis). Films were polycrystalline cubic titanium nitride. 5 nm thick films consisted of many different crystal orientation phases and also amorphous phases. Thicker films (over 50 nm) consisted primarily of <111> crystal orientation. Resistivity was found to depend on the thickness of the film and varied from about 440 μΩcm to about 1600 μΩcm. It should be noted that these films were deposited for experimental use to characterize the material. Barrier layer films are preferably much thinner, as described above.

The average growth rate of titanium nitride films deposited by in situ plasma enhanced ALD was about 0.03 nm/cycle. The films comprise about 2 to about 6 atomic-% residual chlorine. The concentration of titanium in the films was approximately 50 atomic-%, indicating nearly stoichiometric TiN. Films comprised polycrystalline cubic titanium nitride. 5 nm thick films were very crystalline despite the low growth temperature. Thicker films (over 50 nm) consisted mostly of <200> crystal orientation. Resistivity of the films varied in the range of 170 μΩcm to about 430 μΩcm.

EXAMPLE 2

A dielectric layer is deposited on a silicon substrate by atomic layer deposition. A barrier layer of conductive material is deposited over the dielectric layer. The barrier layer is deposited by atomic layer deposition to a thickness of less than about 50 angstroms.

A thin layer of photoresist is spread on the substrate, patterned and selectively removed so that it covers only one of the transistor regions. A thick layer of first gate electrode material is deposited on the substrate and planarized by CMP down to the level of the photoresist. The remaining photoresist is removed from the substrate surface using conventional ashing techniques and a thick layer of second conductive material is deposited over the substrate. The surface of the substrate is then planarized by CMP.

EXAMPLE 3

A dielectric layer is deposited on a silicon substrate by atomic layer deposition. A barrier layer of conductive material is deposited over the dielectric layer. The barrier layer is deposited by atomic layer deposition to a thickness of less than about 50 angstroms.

A thick layer of first conductive material is deposited over the barrier layer. The layer of first conductive material may comprise the same conductive material as the barrier layer or may be a different conductive material.

A thin layer of photoresist is spread on the substrate, patterned and selectively removed. The thick layer of first conductive material is etched so that it covers only one of the transistor regions. The remaining photoresist is removed and a thick layer of second gate electrode material is deposited over the substrate and planarized by CMP down to the level of the thick layer of first conductive material.

A third thick layer of conductive material is subsequently deposited over the substrate. The third thick layer may comprise the same material as one of either the first or second thick layers. Alternatively, the third thick layer may comprise a different material.

The work functions of the PMOS and NMOS regions are determined by the composition of the first and second thick layers.

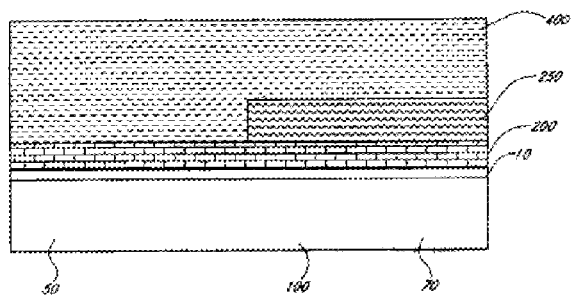

We claim:

1. A method of forming a gate stack in an integrated circuit comprising:
    depositing a dielectric layer over a substrate comprising a first region and a second region by an atomic layer deposition process;
    depositing a barrier layer directly over the dielectric layer by an atomic layer deposition process such that it overlies both the first and second regions; and
    forming a first gate electrode layer over the first region of the substrate and a second gate electrode layer over the second region, wherein the first and second gate electrode layers comprise materials selected from the group consisting of polysilicon, Ti, Ni, Co, TiN, $TiAl_xN_y$, TaN, $TaAl_xN_y$, Ru, $RuO_2$, Ir, $IrO_2$, HfN, $WN_xC_y$, $HfAl_xN_y$, and $HfSi_xN_y$; and
    forming a first and second gate electrode comprising the first and second gate electrode layers respectively, wherein the barrier layer influences the work function of at least one of the first and second gate electrodes.

2. The method of claim 1, wherein the first region is a PMOS region and the second region is an NMOS region.

3. The method of claim 1, wherein the first and second gate electrode layers are adjacent to each other.

4. The method of claim 1, wherein the first gate electrode layer comprises a first gate electrode material and the second gate electrode layer comprises a second gate electrode material.

5. The method of claim 4, wherein the first and second gate electrode materials are conductive.

6. The method of claim 4, wherein the first and second gate electrode materials are different.

7. The method of claim 5 wherein either the first or second gate electrode material is a metal nitride.

8. The method of claim 1, wherein the barrier layer comprises a conductive material.

9. The method of claim 1, wherein the barrier layer is deposited to a thickness of less than about 100 Å.

10. The method of claim 9, wherein the barrier layer is deposited to a thickness of less than about 30 Å.

11. The method of claim 1, additionally comprising treating the dielectric layer to remove OH groups on the surface prior to deposition of the barrier layer.

12. The method of claim 11, wherein the dielectric layer is treated with ammonia gas.

13. The method of claim 11, wherein the dielectric layer is treated with radicals.

14. The method of claim 13, wherein the dielectric layer is treated with nitrogen-hydrogen plasma.

15. The method of claim 1, wherein forming a first gate electrode layer over the first region comprises depositing a layer of first gate electrode material over the first and second regions of the substrate.

16. The method of claim 15, wherein forming a first gate electrode layer over the first region additionally comprises removing first gate electrode material from over the second region of the substrate without removing the underlying barrier layer.

17. The method of claim 16, wherein the first gate electrode material is removed from over the second region of the substrate by chemical mechanical polishing.

18. The method of claim 16, wherein forming the second gate electrode layer comprises depositing a layer of second gate electrode material over the first and second regions of the substrate.

19. The method of claim 16, wherein the first gate electrode material is removed from over the second region of the substrate by differential etching.

20. The method of claim 19, wherein forming the second gate electrode layer over the second region comprises depositing a layer of second gate electrode material over the first and second regions of the substrate and removing second gate electrode material from over the first region without removing the underlying barrier layer.

21. The method of claim 1, additionally comprising depositing a layer of conductive material over the first and second gate electrode layers.

22. The method of claim 1, wherein forming a first gate electrode over the first region of the substrate comprises etching the barrier layer over the second region to a thickness of no more than about 100 angstroms.

23. The method of claim 22, wherein forming a second gate electrode over the second region of the substrate comprising depositing a layer of conductive material over the second region.

24. The method of claim 1, wherein the barrier layer comprises a ternary complex.

25. The method of claim 1, wherein the barrier layer determines the work function of at least one of the first and second gate electrodes.

26. A method of forming a first and second electrode in an integrated circuit comprising:
    depositing a dielectric layer over a substrate comprising a first region and a second region;
    depositing a barrier layer directly over the dielectric layer by atomic layer deposition such that it overlies the first and second regions;
    depositing a first gate electrode material over the first and second regions of the substrate;
    removing first gate electrode material from over the first region without removing the barrier layer;
    depositing a second gate electrode material over the substrate, wherein the first and second gate electrode materials are selected from the group consisting of Ti, Ni, Co, TiN, TiAl$_x$N$_y$, TaN, TaAl$_x$N$_y$, Ru, RuO$_2$, Ir, IrO$_2$, HfN, WN$_x$C$_y$, HfAl$_x$N$_y$ and HfSi$_x$N$_y$, and defining a first and second electrode in the first and second region, wherein the barrier layer influences the work function of one or both of the first and second electrodes.

27. The method of claim 26, wherein the barrier layer comprises a ternary complex.

28. The method of claim 26, wherein the barrier layer determines the work function of one or both of the first and second electrodes.

* * * * *

UNITED STATES PATENT AND TRADEMARK OFFICE
CERTIFICATE OF CORRECTION

PATENT NO. : 7,122,414 B2  Page 1 of 24
APPLICATION NO. : 10/601037
DATED : October 17, 2006
INVENTOR(S) : Hannu Huotari It is certified that error appears in the above-identified patent and that said Letters Patent is hereby corrected as shown below:

Title Page Illustration Figure(s) Should Be Deleted, And Replaced With The Attached Title Page.

Please replace the drawings of sheets 1-22 with the attached drawings.

In Column 13, line 3, Claim 26, after "$HfSi_xN_y$," please delete "," and insert --;--, therefor.

Signed and Sealed this

First Day of April, 2008

JON W. DUDAS
*Director of the United States Patent and Trademark Office*

United States Patent
Huotari

(12) United States Patent
(10) Patent No.: US 7,122,414 B2
(45) Date of Patent: Oct. 17, 2006

(54) METHOD TO FABRICATE DUAL METAL CMOS DEVICES

(75) Inventor: Hannu Huotari, Espoo (FI)

(73) Assignee: ASM International, Inc., Bilthoven (NL)

(*) Notice: Subject to any disclaimer, the term of this patent is extended or adjusted under 35 U.S.C. 154(b) by 0 days.

(21) Appl. No.: 10/601,837

(22) Filed: Jun. 19, 2003

(65) Prior Publication Data
US 2004/0106249 A1    Jun. 3, 2004

Related U.S. Application Data

(60) Provisional application No. 60/430,960, filed on Dec. 3, 2002.

(51) Int. Cl.
H01L 21/8238 (2006.01)

(52) U.S. Cl. .......... 438/199; 438/275; 438/592; 257/369; 257/407; 257/412; 257/E21.002

(58) Field of Classification Search .......... 257/369, 257/388, 407, 412, 751; 438/199, 275, 592
See application file for complete search history.

(56) References Cited

U.S. PATENT DOCUMENTS

| | | | |
|---|---|---|---|
| 5,625,217 A | 4/1997 | Chau et al. | |
| 5,783,478 A | 7/1998 | Chau et al. | |
| 6,066,533 A | 5/2000 | Yu | |
| 6,166,417 A * | 12/2000 | Bai et al. | 257/407 |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,368,954 B1 | 4/2002 | Lopatin et al. | |
| 6,373,111 B1 | 4/2002 | Zheng et al. | |
| 6,383,879 B1 | 5/2002 | Kizilyalli et al. | |
| 6,407,435 B1 | 6/2002 | Ma et al. | |
| 6,458,695 B1 | 10/2002 | Lin et al. | |
| 6,482,740 B1 | 11/2002 | Soininen et al. | |
| 6,506,676 B1 | 1/2003 | Park | |
| 6,511,876 B1 | 1/2003 | Buchanan et al. | |
| 6,518,106 B1 | 2/2003 | Ngai | |
| 6,537,901 B1 | 3/2003 | Cha et al. | |
| 6,579,767 B1 | 6/2003 | Park et al. | |
| 6,596,576 B1 | 7/2003 | Fu et al. | |
| 6,613,695 B1 * | 9/2003 | Pomarede et al. | 438/767 |
| 6,627,503 B1 | 9/2003 | Ma et al. | |
| 6,660,630 B1 * | 12/2003 | Chang et al. | 438/637 |
| 6,696,332 B1 | 2/2004 | Visokay et al. | |
| 6,700,771 B1 | 3/2004 | Bhattacharyya | |
| 6,713,846 B1 | 3/2004 | Senzaki | |
| 6,714,435 B1 | 3/2004 | Dimmler et al. | |
| 6,717,226 B1 | 4/2004 | Hegde et al. | |

(Continued)

FOREIGN PATENT DOCUMENTS

EP    0 854 505 A2    7/1998

(Continued)

OTHER PUBLICATIONS

Chatterjee et al., "CMOS Metal Replacement Gate Transistors using Tantalum Pentoxide Gate Insulator," IEEE, IEDM, 0-7803-4774-9/98, pp. 777-780 (1998).

(Continued)

*Primary Examiner*—Zandra V. Smith
*Assistant Examiner*—Christy L. Novacek
(74) *Attorney, Agent, or Firm*—Knobbe, Martens, Olson & Bear, LLP

(57) ABSTRACT

The present invention relates generally to barrier layers in transistor gate stacks in integrated circuits, and to processes for forming such gate stacks.

28 Claims, 22 Drawing Sheets

Chemical mechanical polishing (CMP)